(12) United States Patent
Long et al.

(10) Patent No.: US 12,191,421 B2
(45) Date of Patent: Jan. 7, 2025

(54) LIGHT EMITTING SUBSTRATE WITH GROOVE IN ELECTRODE PLANARIZATION LAYER FOR LED AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Chunping Long, Beijing (CN); Qi Qi, Beijing (CN); Xinxin Zhao, Beijing (CN); Wanzhi Chen, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 407 days.

(21) Appl. No.: 17/761,253

(22) PCT Filed: Mar. 19, 2021

(86) PCT No.: PCT/CN2021/081847
§ 371 (c)(1),
(2) Date: Mar. 17, 2022

(87) PCT Pub. No.: WO2022/193300
PCT Pub. Date: Sep. 22, 2022

(65) Prior Publication Data
US 2023/0352624 A1   Nov. 2, 2023

(51) Int. Cl.
*H01L 33/38* (2010.01)
*H01L 25/075* (2006.01)
(Continued)

(52) U.S. Cl.
CPC .......... *H01L 33/38* (2013.01); *H01L 25/0753* (2013.01); *H01L 25/167* (2013.01); *H01L 33/62* (2013.01)

(58) Field of Classification Search
CPC ....................................................... H01L 33/38
(Continued)

(56) References Cited

U.S. PATENT DOCUMENTS 10,243,011 B2   3/2019   Park
10,540,046 B2   1/2020   Lai et al.
(Continued)

FOREIGN PATENT DOCUMENTS

CN   106486493 A   3/2017
CN   109213360 A   1/2019
(Continued)

*Primary Examiner* — Ajay Arora
(74) *Attorney, Agent, or Firm* — Dilworth & Barrese, LLP.; Michael J. Musella, Esq.

(57) ABSTRACT

A light emitting substrate and a display device are provided, the light emitting substrate includes: a base substrate: an electrode planarization layer, on the base substrate: an electrode layer, at a side of the electrode planarization layer away from the base substrate, the electrode layer includes a first electrode and a second electrode, the first electrode includes at least one first electrode strip, the second electrode includes at least one second electrode strip, the first electrode strip and the second electrode strip are spaced and alternately arranged in a first direction, each of the at least one first electrode strip and each of the at least one second electrode strip extend along a second direction, the electrode planarization layer includes a first groove between a first electrode strip and a second electrode strip which are adjacent to each other, the first groove is configured to accommodate a light emitting diode.

17 Claims, 12 Drawing Sheets

(51) Int. Cl.
*H01L 25/16* (2023.01)
*H01L 33/62* (2010.01)

(58) Field of Classification Search
USPC .......................................................... 257/79
See application file for complete search history.

(56) References Cited

U.S. PATENT DOCUMENTS

| | | | |
|---|---|---|---|
| 11,227,980 B2 | 1/2022 | Park et al. | |
| 2019/0326477 A1* | 10/2019 | Kim | ........................ H01L 33/20 |
| 2020/0075814 A1* | 3/2020 | Park | .................... H01L 25/0753 |
| 2020/0410921 A1 | 12/2020 | Kim et al. | |
| 2020/0411611 A1 | 12/2020 | Liu et al. | |
| 2021/0082996 A1* | 3/2021 | Ikeda | .................. H01L 25/0753 |
| 2021/0265324 A1 | 8/2021 | Kong et al. | |

FOREIGN PATENT DOCUMENTS

| | | | | |
|---|---|---|---|---|
| CN | 110265458 A | 9/2019 | | |
| CN | 110875348 A | 3/2020 | | |
| CN | 211265475 U | 8/2020 | | |
| CN | 111724744 A | 9/2020 | | |
| CN | 111816119 A | 10/2020 | | |
| CN | 112054048 A | 12/2020 | | |
| CN | 112133253 A | 12/2020 | | |
| CN | 112151576 A | 12/2020 | | |
| EP | 4064356 A1 * | 9/2022 | ......... H01L 27/3276 |
| WO | 2020/017719 A1 | 1/2020 | | |

\* cited by examiner

LIGHT EMITTING SUBSTRATE WITH GROOVE IN ELECTRODE PLANARIZATION LAYER FOR LED AND DISPLAY DEVICE

TECHNICAL FIELD

Embodiments of the present disclosure relate to a light emitting substrate and a display device.

BACKGROUND

With the continuous development of display technology, organic light emitting diode (OLED) display technology has been increasingly used in various electronic devices because of its advantages of self-illumination, wide viewing angle, high contrast, low power consumption and high responding speed.

On the other hand, with the continuous development of the organic light emitting diode display technology, people put forward higher requirements for the performance of the organic light emitting diode display product, such as power consumption, color deviation, brightness, stability and so on.

SUMMARY

The embodiments of the present disclosure provide a light emitting substrate and a display device. Provided by the light-emitting substrate, a first groove is arranged in the electrode planarization layer, and a first electrode strip and a second electrode strip are respectively arranged on two sides of the first groove, so that the light-emitting diode can be mounted in the first groove and driven to emit light through the first electrode strip and the second electrode strip. Therefore, the light emitting substrate can provide a novel light emitting substrate, and has higher luminous efficiency, longer service life, higher product yield and higher display quality.

At least one embodiment of the present disclosure provides a light emitting substrate, which comprises: a base substrate; an electrode planarization layer, located on the base substrate; and an electrode layer, located at a side of the electrode planarization layer away from the base substrate, in which the electrode layer comprises a first electrode and a second electrode, the first electrode comprises at least one first electrode strip, and the second electrode comprises at least one second electrode strip, the at least one first electrode strip and the at least one second electrode strip are spaced and alternately arranged in a first direction, each of the at least one first electrode strip and each of the at least one second electrode strip extend along a second direction, and the second direction intersects with the first direction, the electrode planarization layer comprises a first groove between a first electrode strip and a second electrode strip which are adjacent to each other, and the first groove is configured to accommodate a light emitting diode.

For example, in the light emitting substrate provided by the embodiment of the present disclosure, the first electrode comprises a plurality of first electrode strips, and the second electrode comprises a plurality of second electrode strips, and the plurality of first electrode strips and the plurality of second electrode strips are alternately arranged in the first direction; at least one of the first groove is arranged between any one of the plurality of first electrode strips and a second electrode strip which is adjacent to the any one of the plurality of first electrode strips in the first direction.

For example, in the light emitting substrate provided by the embodiment of the present disclosure, a plurality of the first grooves are arranged between any one of the plurality of first electrode strips and a second electrode strip which is adjacent to the any one of the plurality of first electrode strips in the first direction, and the plurality of the first grooves are arranged along the second direction intersecting with the first direction.

For example, in the light emitting substrate provided by the embodiment of the present disclosure, the first electrode further comprises a first connection electrode, the first connection electrode extends along the second direction intersecting with the first direction and connecting the plurality of the first electrode strips; the second electrode further comprises a second connection electrode, the second connection electrode extends along the second direction and connects the plurality of the second electrode strips; and the first connection electrode is located at a side of the plurality of first electrode strips or the plurality of second electrode strips away from the second connection electrode.

For example, in the light emitting substrate provided by the embodiment of the present disclosure, the electrode planarization layer further comprises: a second groove, located between the first connection electrode and any one of the plurality of second electrode strips; and a third groove, located between the second connection electrode and any one of the plurality of first electrode strips.

For example, in the light emitting substrate provided by the embodiment of the present disclosure, the second groove has a same size and a same shape as the first groove, and the third groove has a same size and a same shape as the first groove.

For example, the light emitting substrate provided by the embodiment of the present disclosure, further comprises: an insulation defining layer, located at a side of the electrode layer away from the base substrate, in which the insulation defining layer comprises a pixel opening, and an orthographic projection of the at least one first groove on the base substrate falls within an orthographic projection of the pixel opening on the base substrate.

For example, in the light emitting substrate provided by the embodiment of the present disclosure, the insulation defining layer further comprises: a retaining wall structure, located in the pixel opening and at least at two sides of the first groove in the first direction.

For example, in the light emitting substrate provided by the embodiment of the present disclosure, a size range of an orthographic projection of the first groove on the base substrate in the first direction is 2 to 50 microns, and a size range of an orthographic projection of the first groove on the base substrate in a direction perpendicular to the first direction is 2 to 50 microns.

For example, in the light emitting substrate provided by the embodiment of the present disclosure, a size range of the first groove in the direction perpendicular to the base substrate is 100 to 5000 nm.

For example, the light emitting substrate provided by the embodiment of the present disclosure, further comprises: a light emitting diode at least partially located in the first groove, in which the light emitting diode comprises a first pin and a second pin, the first pin is connected with the first electrode strip and the second pin is connected with the second electrode strip.

For example, in the light emitting substrate provided by the embodiment of the present disclosure, a size of an orthographic projection of the first groove on the base substrate in the first direction is larger than a size of the light emitting diode in the first direction, and a size of the first groove in a direction perpendicular to the base substrate is larger than ¼ of a size of the light emitting diode in the direction perpendicular to the base substrate.

For example, in the light emitting substrate provided by the embodiment of the present disclosure, the light emitting diode further comprises: a first semiconductor layer, located at a side of the first pin; a light emitting layer, located at a side of the first semiconductor layer away from the first pin; and a second semiconductor layer, located at a side of the light emitting layer away from the first semiconductor layer, in which the second pin is located at a side of the second semiconductor layer away from the light emitting layer.

For example, the light emitting substrate provided by the embodiment of the present disclosure, further comprises: a driving circuit layer, located between the base substrate and the electrode planarization layer, in which the driving circuit layer comprises a plurality of driving circuits, the anode layer comprises a plurality of first electrodes, and the plurality of driving circuits and the plurality of first electrodes are arranged in one-to-one correspondence, and each of the plurality of driving circuits is electrically connected with a corresponding first electrode.

For example, in the light emitting substrate provided by the embodiment of the present disclosure, the driving circuit comprises a driving transistor, a data writing transistor, a first light emission control transistor, a second light emission control transistor, an electrode reset transistor, a reset transistor and a compensation transistor, active layers of the driving transistor, the data writing transistor, the first light emission control transistor, the second light emission control transistor and the electrode reset transistor are made of low-temperature polycrystalline silicon, and active layers of the reset transistor and the compensation transistor are made of a metal oxide.

For example, in the light emitting substrate provided by the embodiment of the present disclosure, a channel width-length ratio of the driving transistor is greater than two times of a channel width-length ratio of the data writing transistor.

For example, in the light emitting substrate provided by the embodiment of the present disclosure, the reset transistor and the compensation transistor adopt a double-gate structure.

At least one embodiment of the present disclosure further provides a display device, and the display device comprises any one of the light emitting substrates mentioned above.

BRIEF DESCRIPTION OF THE DRAWINGS

In order to more clearly explain the technical scheme of the embodiments of the present disclosure, the following will briefly introduce the drawings of the embodiments. Obviously, the drawings in the following description only relate to some embodiments of the present disclosure, but not limit the present disclosure.

DETAILED DESCRIPTION

Figure 1A:
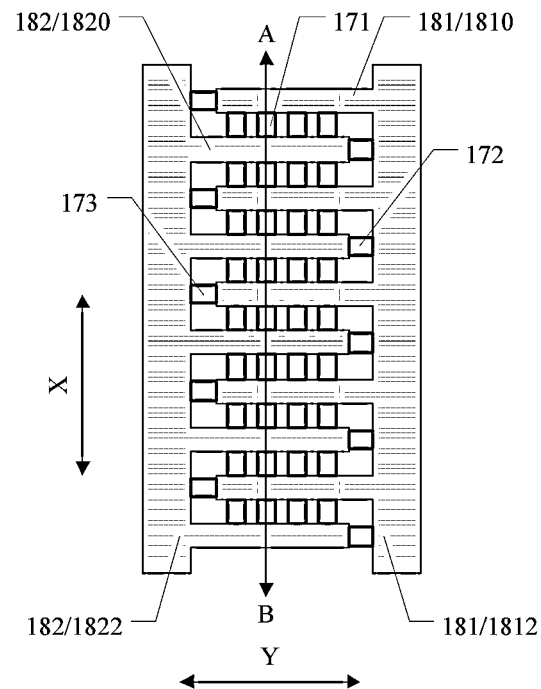
FIG. 1A is a schematic plan view of a light emitting substrate provided by an embodiment of the present disclosure.

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects.

At least one embodiment of the present disclosure provides a light emitting substrate and a display device. The light emitting substrate includes a base substrate, an electrode planarization layer and an electrode layer; the electrode planarization layer is located on the base substrate, and the electrode layer is located at a side of the electrode planarization layer away from the base substrate; the electrode layer includes a first electrode and a second electrode, the first electrode includes at least one first electrode strip, the second electrode includes at least one second electrode strip, the at least one first electrode strip and the at least one second electrode strip are spaced and alternately arranged in a first direction, each of the at least one first electrode strip and each of the at least one second electrode strip extend along a second direction, and the second direction intersects with the first direction; the electrode planarization layer includes a first groove between a first electrode strip and a second electrode strip which are adjacent to each other; the first groove is configured to accommodate the light emitting diode. By arranging the first groove in the electrode planarization layer, the light emitting substrate can mount the light emitting diode in the first groove and drive the light emitting diode to emit light through the first electrode strip and the second electrode strip on two sides of the first groove. Therefore, the light emitting substrate can provide a novel light emitting substrate, and has higher luminous efficiency, longer service life, higher product yield and higher display quality.

Hereinafter, the light emitting substrate and the display device provided by the embodiments of the present disclosure will be described in detail with reference to the accompanying drawings.

Figure 1B:
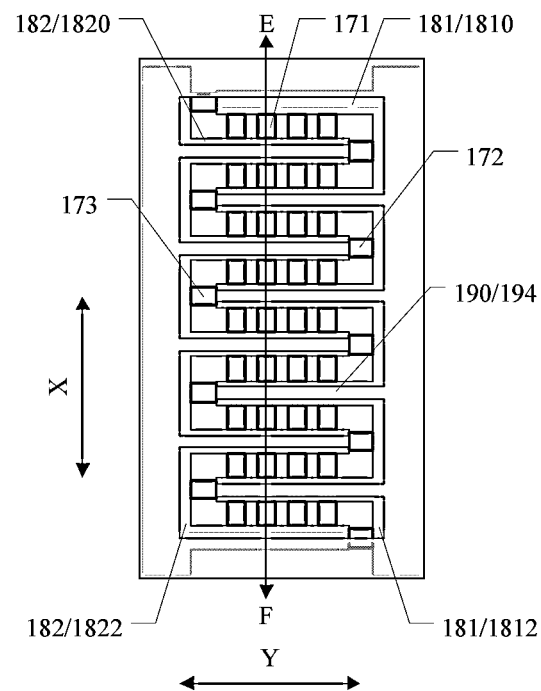
FIG. 1B is a schematic plan view of a light emitting substrate provided by an embodiment of the present disclosure.
Figure 2A:
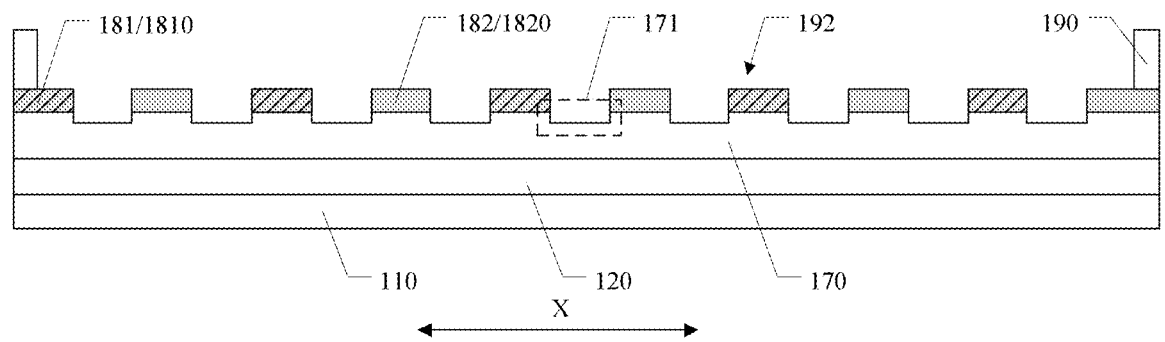
FIG. 2A is a schematic cross-sectional view of a light emitting substrate along a line AB in FIG. 1A provided by an embodiment of the present disclosure.
Figure 2B:
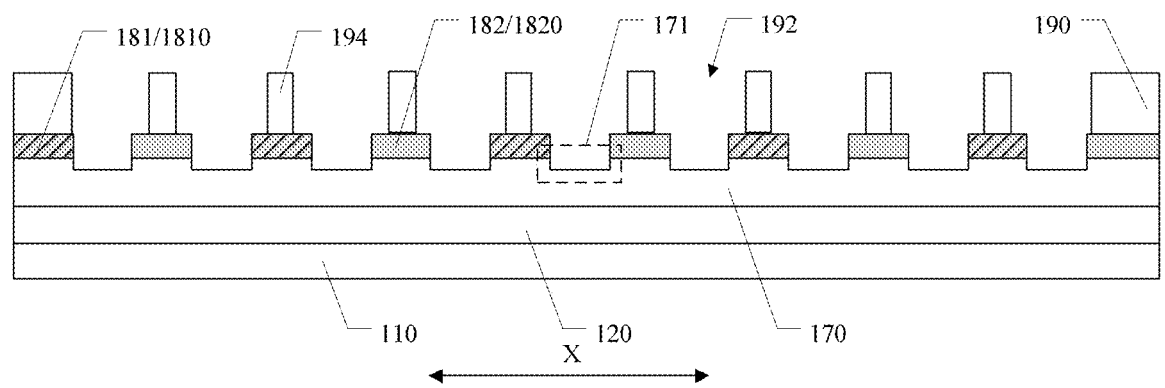
FIG. 2B is a schematic cross-sectional view of a light emitting substrate along a line EF in FIG. 1B provided by an embodiment of the present disclosure.

An embodiment of the present disclosure provides a light emitting substrate. FIG. 1A is a schematic plan view of a light emitting substrate provided by an embodiment of the present disclosure; FIG. 1B is a schematic plan view of another light emitting substrate provided by an embodiment of the present disclosure; FIG. 2A is a schematic cross-sectional view of a light emitting substrate along a line AB in FIG. 1A provided by an embodiment of the present disclosure; FIG. 2B is a schematic cross-sectional view of a light emitting substrate along a line EF in FIG. 1B provided by an embodiment of the present disclosure.

As illustrated by FIGS. 1A and 2A, the light emitting substrate 100 includes a base substrate 110, an electrode planarization layer 170 and an electrode layer 180; the electrode planarization layer 170 is located on the base substrate 110, and the electrode layer 180 is located at a side of the electrode planarization layer 170 away from the base substrate 110. For example, the electrode layer 180 may be a laminated structure of titanium/aluminum/titanium, and a thickness of the electrode layer 180 may range from 800 nm to 1500 nm, such as 1000 nm to 1200 nm; the electrode planarization layer 170 can be made of polyimide (PI), and have a thickness ranging from 10 to 15 microns. Of course, the embodiment of the present disclosure includes, but is not limited thereto, the materials and thicknesses of the electrode layer and the electrode planarization layer can be set according to actual requirements.

As illustrated by FIGS. 1A and 2A, the electrode layer 180 includes a first electrode 181 and a second electrode 182; the first electrode 181 includes at least one first electrode strip 1810, and the second electrode 182 includes at least one second electrode strip 1820. The at least one first electrode strip 1810 and the at least one second electrode strip 1820 are spaced and alternately arranged in a first direction X. Each first electrode strip 1810 and each second electrode strip 1820 extend along a second direction Y, and the second direction intersects with the first direction. The electrode planarization layer 170 includes a first groove 171, which is located between a first electrode strip 1810 and a second electrode strip 1820 which are adjacent to each other. The first groove 171 is configured to accommodate a light emitting diode 200.

In the light emitting substrate provided by the embodiment of the present disclosure, the first groove in the electrode planarization layer can be used to accommodate the light emitting diode, and the first groove is located between the first electrode strip and the second electrode strip which are adjacent to each other. Thus, upon the light emitting diode being placed in the first groove, an anode and a cathode of the light emitting diode can be electrically connected with the first electrode strip and the second electrode strip respectively. Therefore, the light emitting substrate can drive the light emitting diode to emit light through the first electrode strip and the second electrode strip, thereby providing a novel light emitting substrate. Because the light emitting diode (LED) itself has high luminous efficiency and long serve life, the light emitting substrate also has high luminous efficiency and long serve life. In addition, in a manufacturing process of the light emitting substrate, the first groove can play a role of calibrating and positioning the light emitting diode, and can prevent the adjacent light emitting diodes from generating defects such as short circuit, thereby improving the product yield and the display quality of the light emitting substrate. It should be noted that, the anode and the cathode of the above-mentioned light emitting diode can also be pins of the light emitting diode.

It should be noted that, in the manufacturing process of the light emitting substrate provided by the embodiment of the present disclosure, a plurality of light emitting diodes can be mixed with liquid to form a mixed liquid, and then the mixed liquid is coated on the light emitting substrate formed with the first groove; a voltage is applied to the first electrode and the second electrode to form an electric field, in this case, the light emitting diodes can be directionally arranged under the action of the electric field, for example, a connection line between the anode and the cathode of the light emitting diode is parallel to the first direction; finally, the anode and the cathode of the arranged light emitting diode are respectively fixed with the first electrode strip and the second electrode strip. However, the light emitting diode is not strictly arranged under the action of electric field, for example, the connection line between the anode and the cathode of the light emitting diode has a certain angle with the first direction. If the above-mentioned first groove is not provided, risks such as short circuit and uneven distribution may occur between two adjacent light emitting diodes. Therefore, the light emitting substrate provided by the embodiment of the present disclosure can calibrate and position the light emitting diode through the first groove, and can prevent the adjacent light emitting diodes from short circuit and other defects, thereby improving the product yield and display quality of the light emitting substrate.

In addition, although the interval between the first electrode strip and the second electrode strip can be regarded as a groove structure, because the thicknesses of the first electrode strip and the second electrode strip are relatively thin, and are much smaller than the size of the light emitting diode in the direction perpendicular to the base substrate, and the first electrode strip and the second electrode strip cannot play a relatively good role of calibrating and positioning. In addition, the interval between the first electrode strip and the second electrode strip has no limiting effect in the extension direction of the first electrode strip, and thus cannot play a relatively good role of calibrating and positioning. Therefore, the embodiment of the present disclosure provides a light emitting substrate in which the first groove is formed by trenching the electrode planarization layer, which can better play the role of calibrating and positioning the light emitting diode.

In some examples, the base substrate 110 can be a transparent substrate such as a glass substrate, a quartz substrate, and a plastic substrate, and can also be a flexible substrate such as a polyimide substrate. The embodiment of the present disclosure is not limited herein.

In some examples, as illustrated by FIGS. 1A and 2A, the first electrode 181 includes a plurality of first electrode strips 1810, and the second electrode 182 includes a plurality of second electrode strips 1820, the plurality of first electrode strips 1810 and the plurality of second electrode strips 1820 are alternately arranged in the first direction X; any one of the plurality of first electrode strips 1810 and the second electrode strip 1820 adjacent in the first direction X is provided with at least one first groove 171 therebetween. One first electrode 181 and one second electrode 182 can form an electrode pair, and a region defined by one electrode pair corresponds to a sub-pixel region; because the first electrode includes a plurality of first electrode strips and the second electrode includes a plurality of second electrode strips, a plurality of first grooves can be arranged between the first electrode and the second electrode. Therefore, a plurality of light emitting diodes can be arranged in one sub-pixel region of the light emitting substrate; that is, the light emitting diodes arranged in the first grooves 171 between the first electrode 181 and the second electrode 182 emit light in one sub-pixel region. In this case, even if some light emitting diodes in one sub-pixel region cannot work normally due to service life or other defects, the sub-pixel region can still achieve normal display as a whole because the sub-pixel region includes a plurality of light emitting diodes. Therefore, the display substrate can have higher service life and product yield.

In some examples, as illustrated by FIGS. 1A and 2A, any one of the first electrode strips 1810 and the second electrode strip 1820 adjacent to the any one of the first electrode strips 1810 in the first direction X are provided with a plurality of first grooves 171 therebetween, and the plurality of first grooves 171 are arranged in the second direction Y intersecting with the first direction X. Therefore, the light emitting substrate can increase the number and density of the first grooves, thereby increasing the number and density of light emitting diodes and further increasing the light emitting brightness of the light emitting substrate.

In some examples, as illustrated by FIG. 1A, in one sub-pixel region or a region defined by one electrode pair, a plurality of first grooves 171 are arranged in an array, so that the light emitting substrate can have better light emitting uniformity.

In some examples, as illustrated by FIGS. 1A and 2A, the first electrode 181 further includes a first connection electrode 1812, the first connection electrode 1812 extends along the second direction Y intersecting with the first direction X and connects a plurality of the first electrode strips 1810, thereby forming a comb-shaped electrode structure. Similarly, the second electrode 182 further includes a second connection electrode 1822, the second connection electrode 1822 extends along the second direction Y and connects a plurality of second electrode strips 1820, thus forming a comb-shaped electrode structure. In this case, a plurality of first electrode strips 1810 and a plurality of second electrode strips 1820 are alternately arranged in the first direction X. The first connection electrode 1812 is located at the side of the first electrode strips 1810 or the second electrode strips 1820 away from the second connection electrode 1822. Therefore, the first electrode and the second electrode can form an interdigital structure, so that more first electrode strips and second electrode strips can be arranged in a unit area, so that more first grooves can be arranged, and further more light emitting diodes can be arranged to improve the display brightness of the light emitting substrate.

In some examples, as illustrated by FIGS. 1A and 2A, the electrode planarization layer 170 further includes a second groove 172 and a second groove 173; the second groove 172 is located between the first connection electrode 1812 and the second electrode strip 1820, and the third groove 173 is located between the second connection electrode 1822 and the first electrode strip 1810. Therefore, the light emitting substrate can further increase the number of grooves, and further more light emitting diodes can be arranged to improve the display brightness of the light emitting substrate.

In some examples, as illustrated by FIGS. 1A and 2A, because the second groove 172 and the third groove 173 are all configured to accommodate light emitting diodes; in order to facilitate the transfer and placement of a large number of light emitting diodes in the first groove 171, the second groove 172 and the third groove 173, the shapes and sizes of the first groove 171, the second groove 172 and the third groove 173 are the same. For example, the size of the first groove 171 in the first direction is approximately the same as that of the second groove 172 and the third groove 173 in the second direction; the size of the first groove 171 in the second direction is approximately the same as that of the second groove 172 and the third groove 173 in the first direction.

In some examples, as illustrated by FIG. 1A, the plurality of first grooves 171, the plurality of second grooves 172 and the plurality of third grooves 173 are in centrosymmetrical distribution in the light emitting region of a sub-pixel region or a region defined by an electrode pair, so that the light emitting substrate can have better light emitting uniformity.

In some examples, as illustrated by FIGS. 1A and 2A, the first groove 171 does not penetrate the electrode planarization layer 170 in a direction perpendicular to the base substrate 110, that is, a depth of the second groove 171 in the direction perpendicular to the base substrate 110 is less than a thickness of the electrode planarization layer 170 in the direction perpendicular to the base substrate 110.

In some examples, a size of the first groove 171 in the direction perpendicular to the base substrate 110 ranges from 100 nm to 5000 nm.

In some examples, as illustrated by FIG. 1A and FIG. 2A, a size range of an orthographic projection of the first groove 171 on the base substrate 110 in the first direction X is 2 to 50 microns, and a size range of the orthographic projection of the first groove 171 on the base substrate 110 in a direction perpendicular to the first direction X is 2 to 50 microns. Of course, the embodiment of the present disclosure includes but is not limited thereto, and a size of the first groove can be set according to actual needs.

In some examples, as illustrated by FIGS. 1A and 2A, a shape of the orthographic projection of the first groove 171 on the base substrate 110 may be rectangular. Of course, the embodiment of the present disclosure includes but is not limited thereto, and the shape of the orthographic projection of the first groove 171 on the base substrate 110 can be other shapes as long as the shape can match the shape of the light emitting diode. It should be noted that, because the light emitting diode is not necessarily arranged in contact with the bottom of the first groove, the first groove can be divided into an upper part and a lower part in the direction perpendicular to the base substrate, the shape of the orthographic projection of the upper part on the base substrate needs to match the shape of the orthographic projection of the light emitting diode on the base substrate, while the shape of the orthographic projection of the lower part on the base substrate can be different from or not matched with that of the light emitting diode on the base substrate. For example, a cross section of the first groove may be trapezoidal, that is, the lower part of the first groove may have a narrowed structure.

In some examples, as illustrated by FIGS. 1A and 2A, the size of the second groove 172 is the same as that of the first groove 171, and the size of the third groove 173 is the same as that of the first groove 171. That is, a size range of the orthographic projection of the second groove 172 on the base substrate 110 in the first direction X can be 2 to 50 microns, and a size range of the orthographic projection of the second groove 172 on the base substrate 110 in the direction perpendicular to the first direction X can be 2 to 50 microns; a size range of the orthographic projection of the third groove 173 on the base substrate 110 in the first direction X may be 2 to 50 microns, and the size range of the orthographic projection of the third groove 173 on the base substrate 110 in the direction perpendicular to the first direction X may be 2 to 50 microns. It should be noted that, because the second groove and the third groove are both configured to accommodate light emitting diodes, the shapes and sizes of the first groove, the second groove and the third groove are all the same in order to transfer and place a large number of light emitting diodes with the same size in the first groove, the second groove and the third groove.

In some examples, as illustrated by FIGS. 1A and 2A, the light emitting substrate 100 further includes an insulation defining layer 190 located at a side of the electrode layer 180 away from the base substrate 110; the insulation defining layer 190 includes a pixel opening 192, and the orthographic projection of the first groove 171 on the base substrate 110 falls within an orthographic projection of the pixel opening 192 on the base substrate 110. It should be noted that the region defined by the pixel opening can be a light emitting region of a sub-pixel region, and the orthographic projection of the pixel opening on the base substrate is overlapped with the orthographic projection of the electrode pair composed of one first electrode and one second electrode on the base substrate.

In some examples, as illustrated by FIGS. 1A and 2A, in the case where the first electrode 181 includes a plurality of first electrode strips 1810 and the second electrode 182 includes a plurality of second electrode strips 1820, the orthographic projections of all the first grooves 171 between the plurality of first electrode strips 1810 and the plurality of second electrode strips 1820 on the base substrate 110 fall within orthographic projections of the pixel openings 192 on the base substrate 110.

In some examples, as illustrated by FIGS. 1B and 2B, the insulation defining layer 190 further includes a retaining wall structure 194, located in the pixel opening 192 and at least at two sides of the first groove 171 in the first direction X. Therefore, in a manufacturing process of the light emitting substrate, the mounting position of the light emitting diode can be further limited by the retaining wall structure.

For example, as illustrated by FIG. 1B and FIG. 2B, a retaining wall structure 194 can be arranged at a side of each of the plurality of first electrode strips 1810 and each of the plurality of second electrode strips 1820 away from the base substrate 110, and the retaining wall structure 194 can also extend in the second direction Y.

Figure 3A:
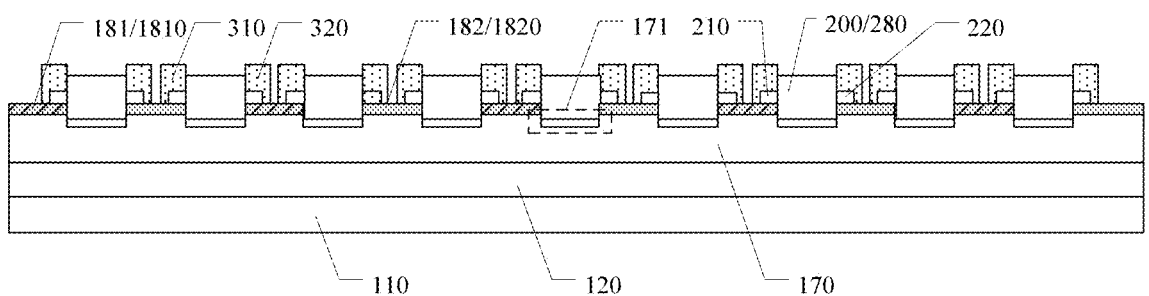
FIG. 3A is a schematic cross-sectional view of another light emitting substrate provided by an embodiment of the present disclosure.

FIG. 3A is a schematic cross-sectional view of another light emitting substrate provided by an embodiment of the present disclosure. As illustrated by FIG. 3A, the light emitting substrate 100 further includes a light emitting diode 200, which is at least partially located in the first groove 171; the light emitting diode 200 includes a main body 280, and a first pin 210 and a second pin 220 respectively located at two sides of the main body 280. The first pin 210 is connected to the first electrode strip 1810, and the second pin 220 is connected to the second electrode strip 1820.

In some examples, as illustrated by FIG. 3A, a size of the orthographic projection of the first groove 171 on the base substrate 110 in the first direction X is larger than a size of the main body 280 of the light emitting diode 200 in the first direction X, and a size of the first groove 171 in a direction perpendicular to the base substrate 110 is larger than ¼ of a size of the light emitting diode 200 in the direction perpendicular to the base substrate 110. Therefore, the first groove can better position and calibrate the light emitting diode.

In some examples, as illustrated by FIG. 3A, an orthographic projection of the first pin 210 on the base substrate 110 is overlapped with an orthographic projection of the first electrode strip 1810 on the base substrate 110, and an orthographic projection of the second pin 220 on the base substrate 110 is overlapped with an orthographic projection of the second electrode strip 1820 on the base substrate 110.

In some examples, as illustrated by FIG. 3A, the light emitting substrate 100 further includes a first fixing electrode 310 and a second fixing electrode 320; the first fixing electrode 310 is located at a side of the first pin 210 away from the base substrate 110, and is configured to fix the first pin 210 with the first electrode strip 1810; the second fixing electrode 320 is located at a side of the second pin 220 away from the base substrate 110, and is configured to fix the second pin 220 with the second electrode strip 1810, thereby improving the stability of the light emitting substrate.

For example, the materials of the first fixing electrode and the second fixing electrode can be selected from silver paste, conductive adhesive tape or metal materials such as copper and gold. Of course, embodiment of the present disclosure includes, but is not limited thereto. In addition, in order to reduce the contact resistance between the first fixing electrode and the first pin and the first electrode strip, and increase the stability of the contact resistance connection between the first fixing electrode and the first pin and the first electrode strip, the first fixing electrode can be annealed after patterning. Similarly, in order to reduce the contact resistance between the second fixing electrode and the second pin and the second electrode strip and increase the stability of the contact resistance connection between the second fixing electrode and the second pin and the second electrode strip, the second fixing electrode can be annealed after patterning.

Figure 3B:
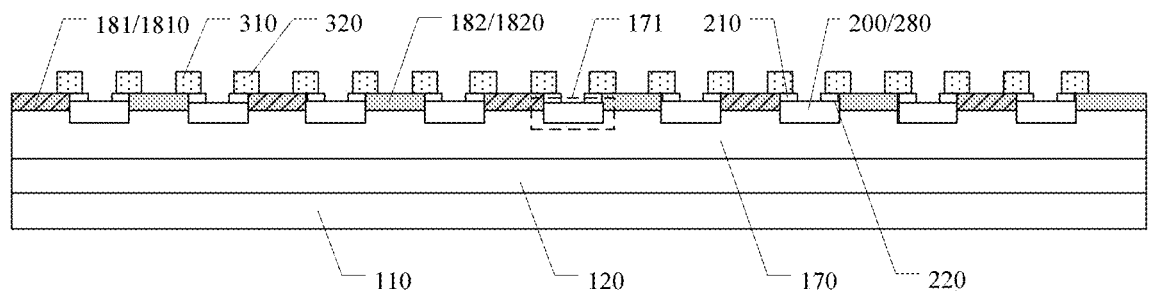
FIG. 3B is a schematic cross-sectional view of another light emitting substrate provided by an embodiment of the present disclosure.

FIG. 3B is a schematic cross-sectional view of another light emitting substrate provided by an embodiment of the present disclosure. As illustrated by FIG. 3B, the light emitting substrate 100 may include another light emitting diode 200, such as a light emitting diode with an inverted structure, and the light emitting diode 200 is at least partially located in the first groove 171. The light emitting diode 200 includes a main body 280, and a first pin 210 and a second pin 220 located at the same side of the main body 280. The first pin 210 is connected with the first electrode strip 1810, and the second pin 220 is connected with the second electrode strip 1820.

In some examples, as illustrated by FIG. 3B, a size of the orthographic projection of the first groove 171 on the base substrate 110 in the first direction X is larger than a size of the light emitting diode 200 in the first direction X. In this case, the orthographic projection of the first pin 210 on the base substrate 110 is not overlapped with the orthographic projection of the first electrode strip 1810 on the base substrate 110, but a boundary of the orthographic projection of the first pin 210 on the base substrate 110 is in contact with a boundary of the orthographic projection of the first electrode strip 1810 on the base substrate 110, and the orthographic projection of the second pin 220 on the base substrate 110 is not overlapped with the orthographic projection of the second electrode strip 1820 on the base substrate 110, but a boundary of the orthographic projection of the second pin 220 on the base substrate 110 is in contact with a boundary of the orthographic projection of the second electrode strip 1820 on the base substrate 110. The first pin 210 can contact the first electrode strip 1810 through its lateral surface, or be electrically connected with the first electrode strip 1810 through the first fixing electrode 310; the second pin 220 can be arranged in contact with the second electrode strip 1820 through its lateral surface, or be electrically connected with the second electrode strip 1810 through the second fixing electrode 320.

In some examples, in order to improve the light output efficiency of the light emitting substrate, reflective materials can be arranged at the bottom and lateral surfaces of the groove (including at least one of the first groove, the second groove and the third groove mentioned above), so that the light emitted by the light emitting diode can be emitted from a direction away from the base substrate as much as possible. Of course, the embodiment of the present disclosure includes, but is not limited thereto, a reflective layer can also be arranged at a side of the light emitting diode close to the base substrate, so that the light emitted by the light emitting diode can be emitted from the direction away from the base substrate as much as possible.

In some examples, the bottom and lateral surface of the groove (including at least one of the above-mentioned first groove, second groove and third groove) can be roughened, so that specular reflection of ambient light can be prevented from affecting the normal display or light emission of the light emitting substrate.

Figure 4:
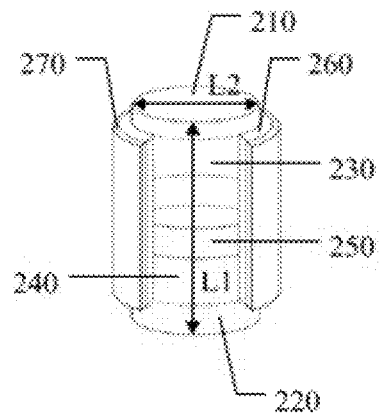
FIG. 4 is a schematic diagram of a light emitting diode provided by an embodiment of the present disclosure.

FIG. 4 is a schematic diagram of a light emitting diode provided by an embodiment of the present disclosure. As illustrated by FIG. 4, the light emitting diode 200 further includes a first semiconductor layer 230 located at a side of the first pin 210; a light emitting layer 250, located at a side of the first semiconductor layer 230 away from the first pin 210; and a second semiconductor layer 240 located at a side of the light emitting layer 250 away from the first semiconductor layer 230; the second pin 220 is located at a side of the second semiconductor layer 250 away from the light emitting layer 240.

In some examples, as illustrated by FIG. 4, the light emitting diode 200 further includes an insulating layer 260 and a hydrophobic layer 270; the insulating layer 260 is located at the periphery of the first semiconductor layer 230, the light emitting layer 250 and the second semiconductor layer 260, and encapsulates the first semiconductor layer 230, the light emitting layer 250 and the second semiconductor layer 260; the hydrophobic layer 270 is located at the periphery of the insulating layer 260 and encapsulates the insulating layer 260. Therefore, the insulating layer 260 and the hydrophobic layer 270 can protect the first semiconductor layer 230, the light emitting layer 250 and the second semiconductor layer 260, and prevent water and oxygen corrosion.

In some examples, as illustrated by FIG. 4, a size L1 of the light emitting diode 200 in a direction from the first pin 210 to the second pin 220 may range from 1.8 to 2.2 microns, such as 2 microns; a size L2 of the first pin 210 or the second pin 220 of the light emitting diode 200 in the direction perpendicular to the direction from the first pin 210 to the second pin 220 may range from 0.5 to 0.74 microns, such as 0.62 microns. It can be understood that, upon the light emitting diode 200 shown in FIG. 4 being arranged on a structure of the light emitting substrate provided by the present application, the schematic cross-sectional view shown in FIG. 3A can be obtained.

In some examples, the materials of the first pin 210 and the second pin 220 may be selected from at least one selected from the group consisting of chromium (Cr), titanium (Ti), aluminum (Al), gold (Au), nickel (Ni) and indium tin oxide (ITO), or may be an alloy of at least two selected from the group consisting of chromium (Cr), titanium (Ti), aluminum (Al), titanium (Ti), aluminum (Al), gold (Au), nickel (Ni) and indium tin oxide (ITO). The thicknesses of the first pin 210 and the second pin 220 may range from 1 nm to 100 nm. Of course, the embodiment of the present disclosure includes, but is not limited thereto, the materials and thicknesses of the first pin and the second pin can be set according to actual needs.

In some examples, the first semiconductor layer 230 may adopt an N-type semiconductor layer, such as a semiconductor material represented by a structural formula InxAlyGa1-x-yN ($0 \leq x \leq 1$, $0 \leq y \leq 1$, $0 \leq x+y \leq 1$).

For example, a material of the first semiconductor layer 230 can be one or more selected from the group consisting of aluminum indium gallium nitride, gallium nitride (GaN), aluminum gallium nitride (AlGaN), indium gallium nitride (InGaN), aluminum nitride (AlN) and indium nitride (InN); a thickness of the first semiconductor layer 230 may range from 500 nm to 5000 nm.

For example, the light emitting layer 250 may have a single quantum well structure or a multi-quantum well structure; a material of the light emitting layer 250 may be aluminum gallium nitride, indium aluminum gallium nitride (AlInGaN), etc. A thickness of the light emitting layer 250 may be 10 to 200 nm.

In some examples, the second semiconductor layer 240 may adopt a P-type semiconductor layer, such as a semiconductor material represented by a structural formula InxAlyGa1-x-yN ($0 \leq x \leq 1$, $0 \leq y \leq 1$, $0 \leq x+y \leq 1$).

For example, a material of the second semiconductor layer 240 can be one or more selected from the group consisting of aluminum indium gallium nitride, gallium nitride, aluminum gallium nitride, indium gallium nitride, aluminum nitride and indium nitride; and a thickness of the second semiconductor layer 250 may be 50 to 500 nm.

Figure 5:
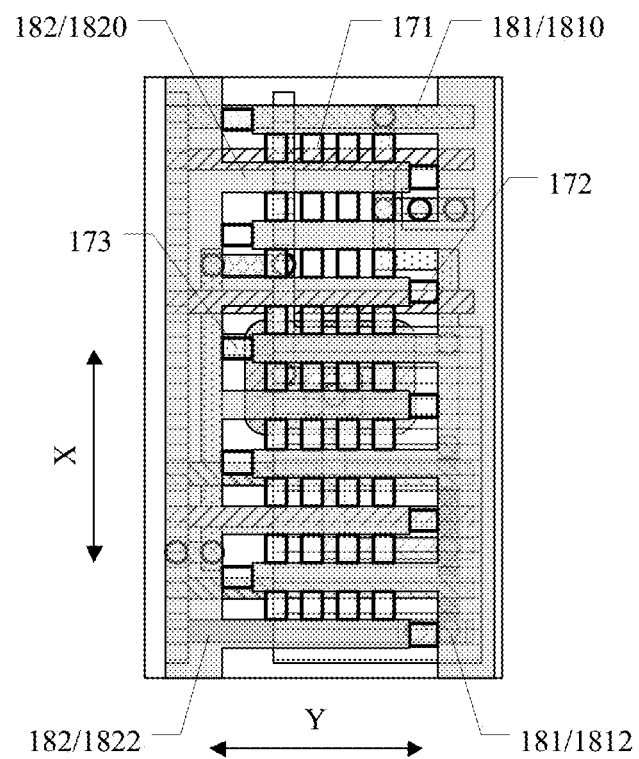
FIG. 5 is a schematic plan view of another light emitting substrate provided by an embodiment of the present disclosure.
Figure 6:
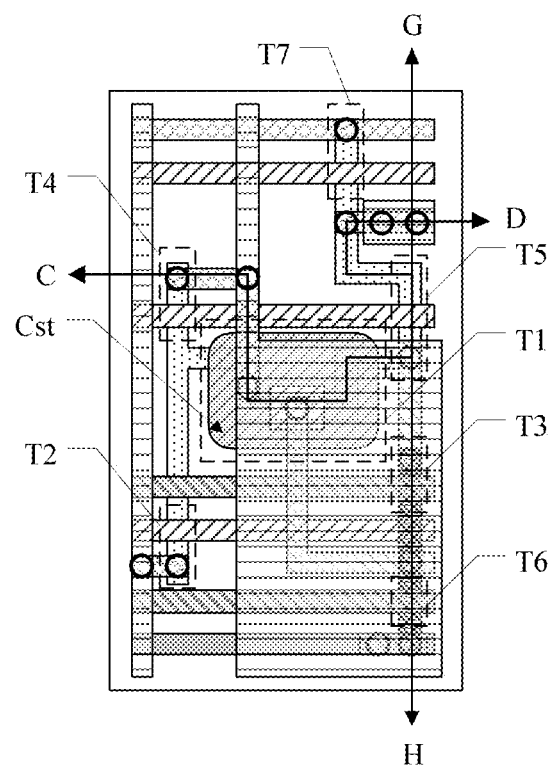
FIG. 6 is a schematic plan view of another light emitting substrate provided by an embodiment of the present disclosure.
Figure 7A:
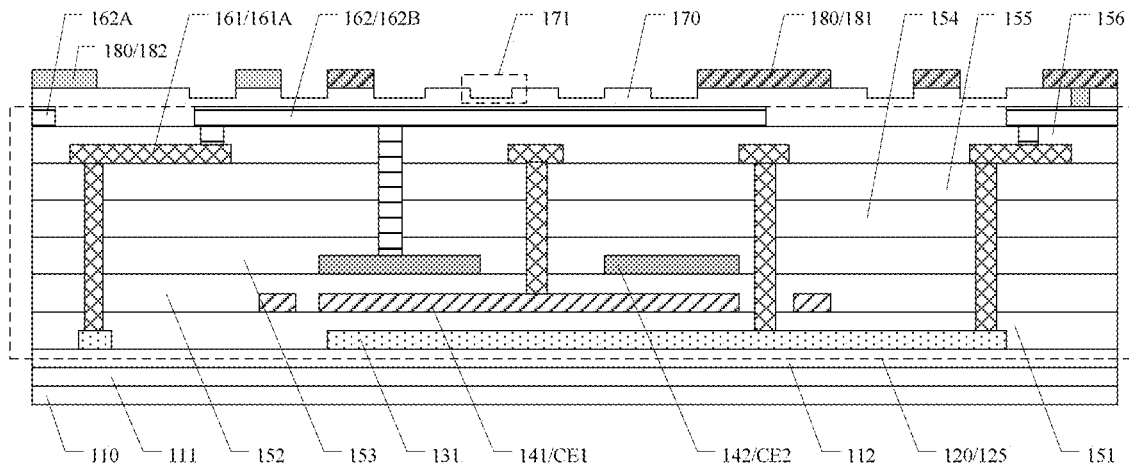
FIG. 7A is a schematic cross-sectional view of another light emitting substrate along a line CD in FIG. 6 provided by an embodiment of the present disclosure.
Figure 7B:
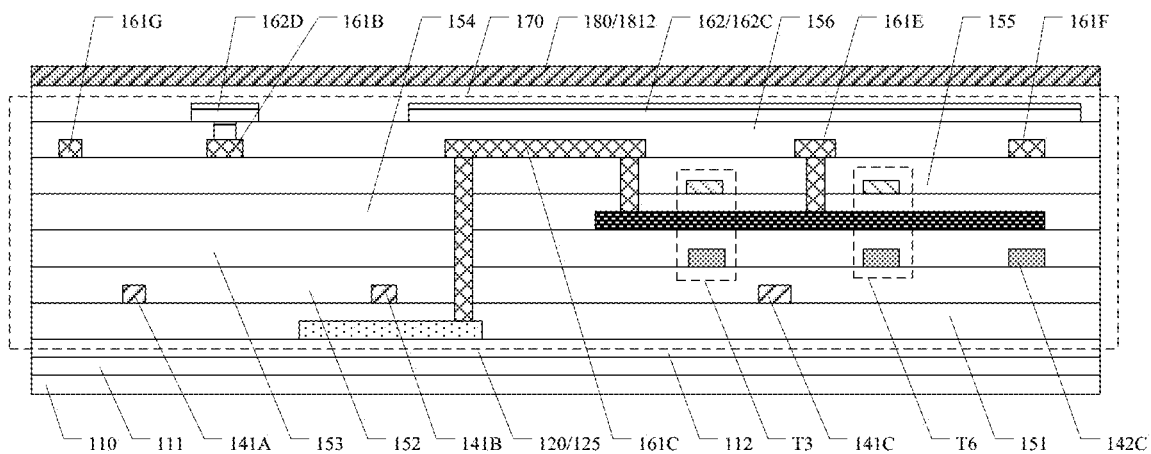
FIG. 7B is a schematic cross-sectional view of another light emitting substrate along a line GH in FIG. 6 provided by an embodiment of the present disclosure.
Figure 8:
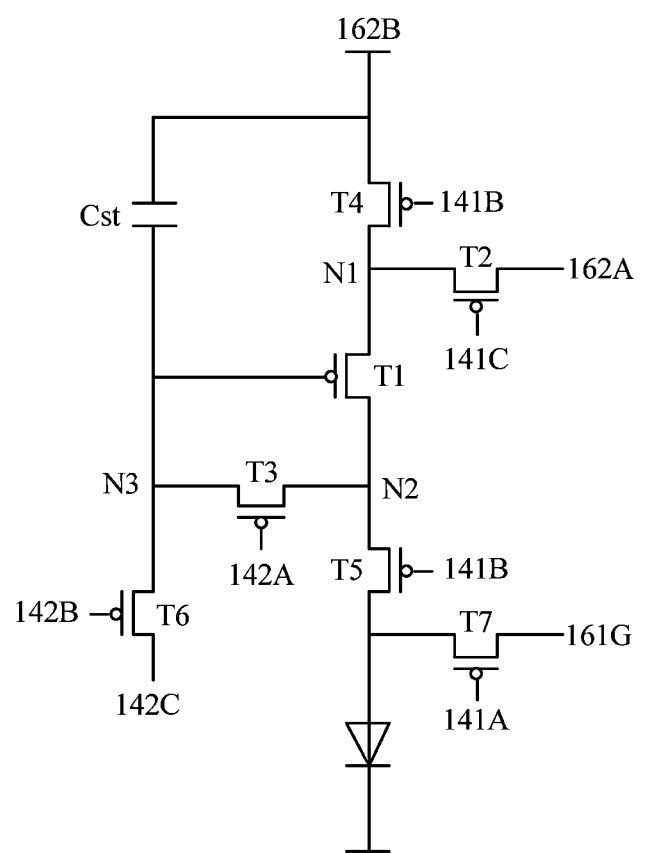
FIG. 8 is an equivalent schematic diagram of a driving circuit of another light emitting substrate provided by an embodiment of the present disclosure.

FIG. 5 is a schematic plan view of another light emitting substrate provided by an embodiment of the present disclosure; FIG. 6 is a schematic plan view of another light emitting substrate provided by an embodiment of the present disclosure; FIG. 7A is a schematic cross-sectional view of another light emitting substrate along a line CD in FIG. 6 provided by an embodiment of the present disclosure; FIG. 7B is a schematic cross-sectional view of another light emitting substrate along a line GH in FIG. 6 provided by an embodiment of the present disclosure; FIG. 8 is an equivalent schematic diagram of a driving circuit of another light emitting substrate provided by an embodiment of the present disclosure. It should be noted that, in order to better show the line CD, the light emitting substrate shown in FIG. 6 does not show the electrode layer.

As illustrated by FIG. 5, FIG. 6, FIG. 7A and FIG. 7B, the light emitting substrate 100 includes a base substrate 110, an electrode planarization layer 170 and an electrode layer 180; the electrode planarization layer 170 is located on the base substrate 110, and the electrode layer 180 is located at a side of the electrode planarization layer 170 away from the base substrate 110. The electrode layer 180 includes a first electrode 181 and a second electrode 182; the first electrode 181 includes at least one first electrode strip 1810, and the second electrode 182 includes at least one second electrode strip 1820. The at least one first electrode strip 1810 and the at least one second electrode strip 1820 are alternately arranged in the first direction X; the electrode planarization layer 170 includes a first groove 171, and the first groove 171 is located between the first electrode strip 1810 and the second electrode strip 1820 which are adjacent to each other. The first groove 171 is configured to accommodate a light emitting diode 200. Similarly, because the first groove in the electrode planarization layer can be used to accommodate the light emitting diode, and the two sides of the first groove are respectively provided with the first electrode strip and the second electrode strip, upon the light emitting diode being placed in the first groove, an anode and a cathode of the light emitting diode can be in contact with the first electrode strip and the second electrode strip, respectively. Therefore, the light emitting diode can be driven to emit light through the first electrode strip and the second electrode strip, so that a novel light emitting substrate can be provided. Because the light emitting diode (LED) itself has high luminous efficiency and service life, the light emitting substrate also has high luminous efficiency and service life. In addition, in the manufacturing process of the light emitting substrate, the first groove can play a role of calibrating and positioning the light emitting diode, and can prevent the adjacent light emitting diodes from generating defects such as short circuit, thereby improving the product yield and display quality of the light emitting substrate.

As illustrated by FIG. 5, FIG. 6, FIG. 7A and FIG. 7B, the light emitting substrate 100 further includes a driving circuit layer 120 located between the base substrate 110 and the electrode planarization layer 170; the driving circuit layer 120 includes a plurality of driving circuits 125; the electrode layer 180 includes a plurality of first electrodes 181; the plurality of driving circuits 125 and the plurality of first electrodes 181 can be arranged in one-to-one correspondence, that is, one first electrode 181 corresponds to one driving circuit 125; the driving circuit 120 is electrically connected with a corresponding first electrode 181, thereby providing a driving signal for the first electrode 181.

In some examples, as illustrated by FIG. 5, FIG. 6, FIG. 7A and FIG. 7B, the light emitting substrate 100 further includes a barrier layer 111 and a buffer layer 112, which are used to modify defects on the base substrate or provide a smoother substrate with higher matching degree with the material of the film layer to be prepared for the subsequent semiconductor layer.

In some examples, the barrier layer 111 and the buffer layer 112 may adopt a single-layer structure or a multi-layer structure. For example, the barrier layer 111 may be a laminated structure of silicon oxide/monocrystalline silicon/silicon oxide, and the buffer layer 112 may be a laminated structure of silicon nitride and silicon oxide. A thickness of the barrier layer 111 may range from 10 to 30 microns; a thickness of the buffer layer 112 may range from 2 to 5 microns. Of course, the embodiment of the present disclosure includes, but is not limited thereto, the materials and thicknesses of the barrier layer and the buffer layer can be set according to actual needs.

In some examples, as illustrated by FIG. 6, FIG. 7A, FIG. 7B and FIG. 8, the driving circuit 125 includes a driving transistor T1, a data writing transistor T2, a first light emission control transistor T4, a second light emission control transistor T5, an electrode reset transistor T7, a reset transistor T6 and a compensation transistor T3. Therefore, the driving circuit can adopt a 7T1C structure, and in this case, the driving circuit 125 can further include a storage capacitor Cst. Of course, the embodiment of the present disclosure includes, but is not limited thereto, and the driving circuit can also adopt other suitable structures.

In some examples, as illustrated by FIG. 6, FIG. 7A, FIG. 7B and FIG. 8, a source electrode of the driving transistor T1, a drain electrode of the data writing transistor T2 and a drain electrode of the first light emission control transistor T4 are connected to a first node N1; a drain electrode of the driving transistor T1, a source electrode of the compensation transistor T3 and a source electrode of the second light emission control transistor T5 are connected to a second node N2; a gate electrode of the driving transistor T1, a drain electrode of the compensation transistor T3 and a drain electrode of the reset transistor T6 are connected to a third node N3.

In some examples, because the driving transistor T1, the data writing transistor T2, the first light emission control transistor T4, the second light emission control transistor T5 and the electrode reset transistor T7 need higher mobility and more stable source voltage, low-temperature polycrystalline silicon (LTPS) type transistors can be adopted, that is, active layers of the driving transistor T1, the data writing transistor T2, the first light emission control transistor T4, the second light emission control transistor T5 and the electrode reset transistor T7 are low-temperature polycrystalline silicon.

In some examples, because the reset transistor T6 and the compensation transistor T3 need to have lower leakage current, oxide transistors can be used, that is, active layers of the reset transistor T6 and the compensation transistor T3 are metal oxides, such as indium gallium zinc oxide, or c-axis oriented crystal oxide semiconductors. In this case, the reset transistor T6 and the compensation transistor T1 can also better maintain the voltage stability of the storage capacitor.

FIGS. 9A-9E are schematic layout diagrams of a driving circuit of a light emitting substrate provided by an embodiment of the present disclosure. The driving circuit shown in FIGS. 9A-9E is the same as that shown in FIG. 6.

Figure 9A:
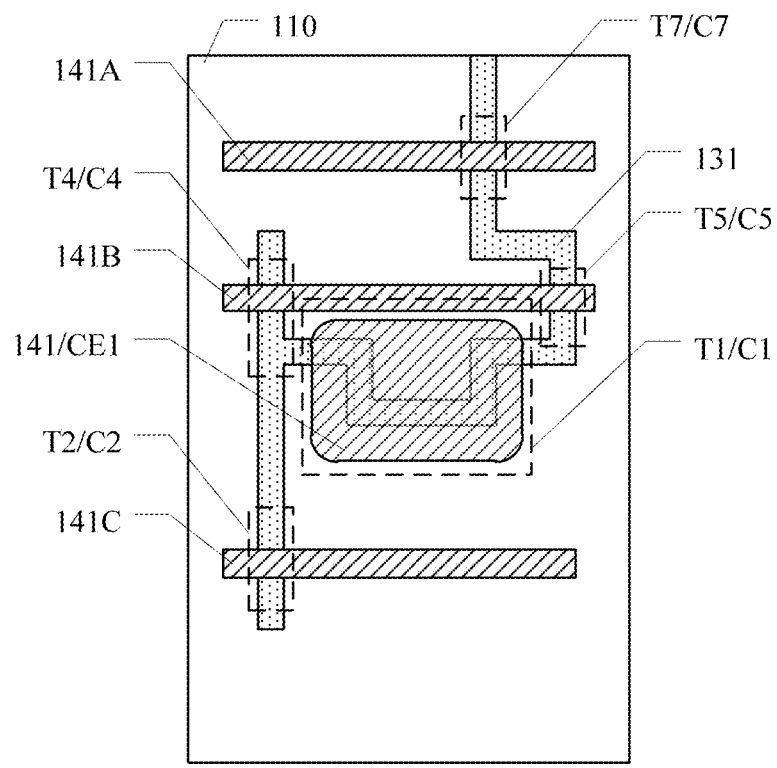
FIGS. 9A-9E are schematic layout diagrams of a driving circuit of a light emitting substrate provided by an embodiment of the present disclosure.

As illustrated by FIG. 9A, the light emitting substrate 100 includes a base substrate 110, a first semiconductor layer 131 and a first gate layer 141; the first semiconductor layer 131 is located on the base substrate 110, and the first gate layer 141 is located at a side of the first semiconductor layer 131 away from the base substrate. The first semiconductor layer 131 includes an active layer C1 of the driving transistor T1, an active layer C2 of the data writing transistor T2, an active layer C4 of the first light emission control transistor T4, an active layer C5 of the second light emission control transistor T5 and an active layer C7 of the electrode reset transistor T7. The first semiconductor layer 131 can be made of low-temperature polycrystalline silicon (LTPS) material, so that the driving transistor T1, the data writing transistor T2, the first light emission control transistor T4, the second light emission control transistor T5 and the electrode reset transistor T7 need higher mobility and more stable source voltage.

It should be noted that a first insulating layer 151 is disposed between the first semiconductor layer 131 and the first gate layer 141. In order to clearly show the relationship between the first semiconductor layer 131 and the first gate layer 141, the first insulating layer 151 is not shown in FIG. 9A. The arrangement of the first insulating layer 151 can be seen in FIGS. 7A and 7B.

In some examples, the first semiconductor layer 131 is made of polysilicon, and a thickness of the first semiconductor layer 131 may range from 400 to 600 nm, such as 582 nm. The first gate layer 141 is made of molybdenum, and a thickness of the first gate layer 141 can range from 2000 to 4000 nm, for example, 2800 nm.

As illustrated by FIG. 9A, the first gate layer 141 includes a first reset signal line 141A, a light emission control line 141B, a first gate line 141C and a first electrode block CE1; the first reset signal line 141A, the light emission control line 141B, the first electrode block CE1 and the first gate line 141C can be arranged in sequence, and an orthographic projection of the first electrode block CE1 on the base substrate 110 is located between an orthographic projection of the light emission control line 141B and the orthographic projection of the first gate line 141C on the base substrate 110.

As illustrated by FIG. 9A, the first reset signal line 141A is overlapped with an active layer C7 of the electrode reset transistor T7, that is, an orthographic projection of the first reset signal line 141A on the base substrate 110 is overlapped with an orthographic projection of the active layer C7 of the electrode reset transistor T7 on the base substrate 110. The light emission control line 141B is overlapped with an active layer C4 of the first light emission control transistor T4 and an active layer C5 of the second light emission control transistor T5, that is, an orthographic projection of the light emission control line 141B on the base substrate 110 is overlapped with orthographic projections of the active layer C4 of the first light emission control transistor T4 and the active layer C5 of the second light emission control transistor T5 on the base substrate 110, respectively. The first gate line 141C is overlapped with an active layer C2 of the data writing transistor T2, that is, an orthographic projection of the first gate line 141C on the base substrate 110 is overlapped with an orthographic projection of the active layer C2 of the data writing transistor T2 on the base substrate 110.

As illustrated by FIG. 9A, a channel width-length ratio of the driving transistor T1 is larger than two times of a channel width-length ratio of the data writing transistor T2, which is beneficial to reducing current fluctuation and improving the stability of the output current.

As illustrated by FIG. 9A, a source electrode of the driving transistor T1, a drain electrode of the data writing transistor T2 and a drain electrode of the first light emission control transistor T4 are connected in the first semiconductor layer 131; a drain electrode of the driving transistor T1 and a source electrode of the second light emission control transistor T5 are also connected in the first semiconductor layer 131.

Figure 9B:
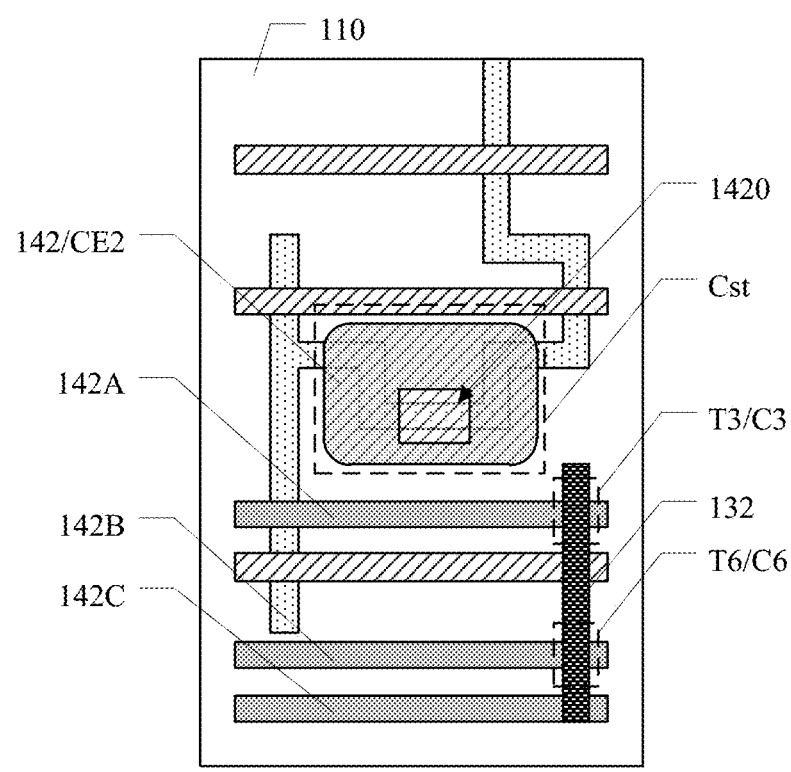

As illustrated by FIG. 9B, the light emitting substrate 100 further includes a second gate layer 142 and a second semiconductor layer 132; the second gate layer 142 is located at a side of the first gate layer 141 away from the base substrate 110, and the second semiconductor layer 132 is located at a side of the second gate layer 142 away from the base substrate 110. The second semiconductor layer 132 can be made of metal oxide, so that the reset transistor T6 and the compensation transistor T3 have lower leakage current.

It should be noted that a second insulating layer 152 is disposed between the second semiconductor layer 132 and the second gate layer 142. In order to clearly show the relationship between the second semiconductor layer 132 and the second gate layer 142, the second insulating layer 152 is not shown in FIG. 9B. The arrangement of the second insulating layer 152 can be seen in FIGS. 7A and 7B.

In some examples, the second gate layer 142 can be made of molybdenum, and has a thickness ranging from 2000 to 4000 nm, such as 3000 nm. The second semiconductor layer 132 is made of indium gallium zinc oxide (IGZO), and a thickness of the second semiconductor layer 132 can range from 300 nm to 600 nm, such as 445 nm. Of course, the second semiconductor layer 132 can also be made of other metal oxide semiconductors, such as c-axis oriented crystal oxide semiconductors.

As illustrated by FIG. 9B, the second gate layer 142 includes a second electrode block CE2, a second gate line 142A, a second reset line 142B and a first initialization signal line 142C; the second electrode block CE2, the second gate line 142A, the second reset line 142B and the first initialization signal line 142C may be sequentially arranged. Orthographic projections of the second electrode block CE2 and the second gate line 142A on the base substrate 110 are located between an orthographic projection of the light emission control line 141B and an orthographic projection of the first gate line 141C on the base substrate 110; orthographic projections of the second reset line 142B and the first initialization signal line 142C on the base substrate 110 are located at a side of the orthographic projection of the first gate line 141C on the base substrate 110 away from the orthographic projection of the second gate line 142A on the base substrate 110.

As illustrated by FIG. 9B, the second semiconductor layer 132 includes an active layer C3 of the compensation transistor T3 and an active layer C6 of the reset transistor T6; and a drain electrode of the compensation transistor T3 and a drain electrode of the reset transistor T6 are connected in the second semiconductor layer 132.

As illustrated by FIG. 9B, an orthographic projection of the second electrode block CE2 on the base substrate 110 overlaps with an orthographic projection of the first electrode block CE1 on the base substrate 110, so that a storage capacitor Cst can be formed. The second electrode block CE2 may be provided with an opening 1420 to expose a part of the first electrode block CE1. An orthographic projection of the opening 1420 on the base substrate 110 overlaps with an orthographic projection of the active layer C1 of the driving transistor T1 on the base substrate 110. The second gate line 142A overlaps with the active layer C3 of the compensation transistor T3, that is, an orthographic projection of the second gate line 142 on the base substrate 110 overlaps with an orthographic projection of the active layer C3 of the compensation transistor T3 on the base substrate 110. The second reset line 142B overlaps with an active layer C6 of the reset transistor T6, that is, an orthographic projection of the second reset line 142B on the base substrate 110 overlaps with an orthographic projection of the active layer C6 of the reset transistor T6 on the base substrate 110. The first initialization signal line 142C overlaps with a source electrode of the reset transistor T6, that is, an orthographic projection of the first initialization signal line 142C on the base substrate 110 overlaps with an orthographic projection of the source electrode of the reset transistor T6 on the base substrate 110.

Figure 9C:
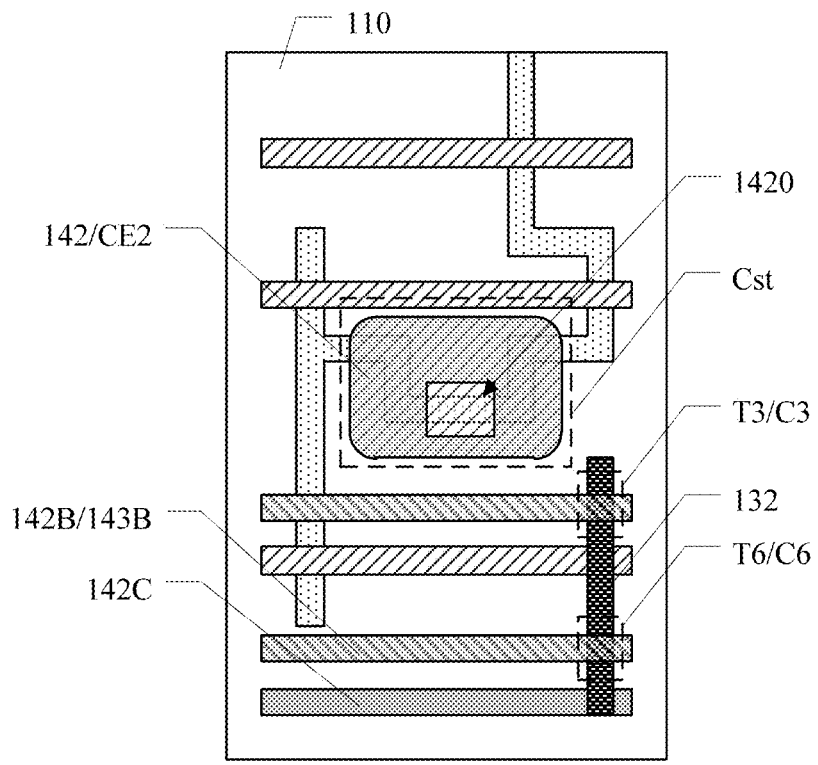

As illustrated by FIG. 9C, the light emitting substrate 100 further includes a third gate layer 143, which is located at a side of the second semiconductor layer 132 away from the base substrate 110. It should be noted that, a third insulating layer 153 is disposed between the second semiconductor layer 132 and the third gate layer 143. In order to clearly show the relationship between the second semiconductor layer 132 and the third gate layer 143, the third insulating layer 153 is not shown in FIG. 9C, and the arrangement of the third insulating layer 153 can be seen in FIGS. 7A and 7B.

In some examples, the third gate layer 143 may be a laminated structure of molybdenum metal and titanium nitride, the titanium nitride is located at a side of the molybdenum metal close to the base substrate, and a thickness of the third gate layer 143 may range from 2000 nm to 4000 nm, for example, a thickness of molybdenum metal is 2678 nm, and a thickness of titanium nitride is 338 nm. It should be noted that because the third insulating layer is set to be relatively thin, in order to prevent the molybdenum metal from diffusing into the third insulating layer, the titanium nitride can be set to prevent diffusion.

As illustrated by FIG. 9C, the third gate layer 143 includes a first auxiliary line 143A and a second auxiliary line 143B; an orthographic projection of the first auxiliary line 143A on the base substrate 110 overlaps with an orthographic projection of the active layer C3 of the compensation transistor T3 on the base substrate 110; an orthographic projection of the second auxiliary line 143B on the base substrate 110 overlaps with an orthographic projection of an active layer C6 of the reset transistor T6 on the base substrate 110. In this case, the first auxiliary line 143A and the second gate line 142A have the same potential, and the second auxiliary line 143B and the second reset signal line 142B have the same potential. Therefore, the reset transistor T6 and the compensation transistor T3 have a double-gate structure, so that the leakage current can be further reduced. Of course, the embodiment of the present disclosure includes, but is not limited to, the reset transistor T6 and the compensation transistor T3 may not adopt a double-gate structure.

As illustrated by FIG. 9C, the orthographic projection of the first auxiliary line 143A on the base substrate 110 overlaps with the orthographic projection of the second gate line 142A on the base substrate 110; the orthographic projection of the second auxiliary line 143B on the base substrate 110 overlaps with the orthographic projection of the second reset line 142B on the base substrate 110.

Figure 9D:
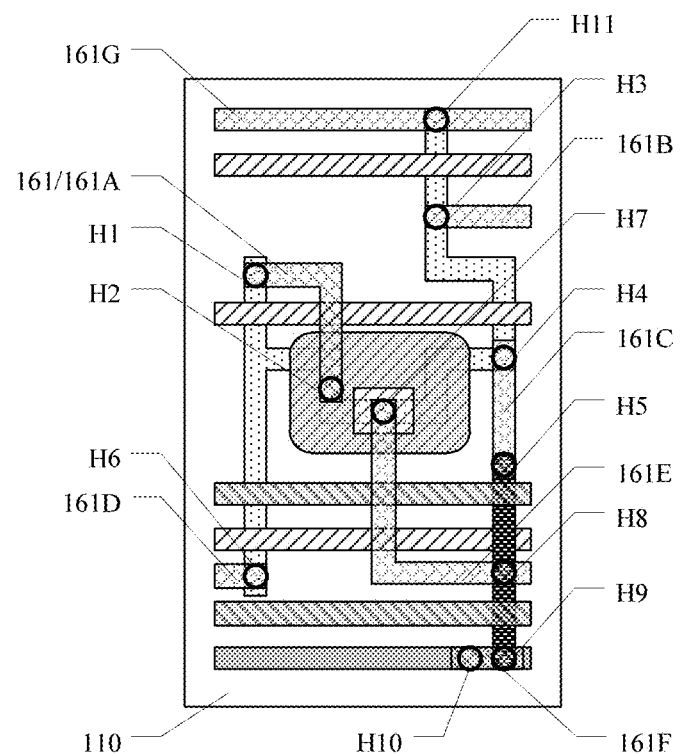

As illustrated by FIG. 9D, the light emitting substrate 110 further includes a first conductive layer 161, which is located at a side of the third gate layer 143 away from the base substrate 110. It should be noted that, a fourth insulating layer 154 is arranged between the third gate layer 143 and the first conductive layer 161. In order to clearly show the relationship between the first conductive layer 161 and the film layer under the first conductive layer 161, the fourth insulating layer 154 is not shown in FIG. 9D, and the arrangement of the fourth insulating layer 154 can be seen in FIGS. 7A and 7B.

In some examples, the first conductive layer 161 may be a laminated structure of titanium/aluminum/titanium with a thickness ranging from 5,000 nm to 8,000 nm; for example, thicknesses of titanium metal can be 342 nm and 570 nm respectively, and a thickness of aluminum metal can be 6026 nm.

As illustrated by FIG. 9D, the first conductive layer 161 includes a first connection block 161A, a second connection block 161B, a third connection block 161C, a fourth connection block 161D, a fifth connection block 161E, a sixth connection block 161F and a second initialization signal line 161G.

As illustrated by FIG. 9D, the first connection block 161A is electrically connected with a source electrode of the first light emission control transistor T4 through a first via hole H1, and the first connection block 161A is electrically connected with the second electrode block CE2 through a second via hole H2, so that the source electrode of the first light emission control transistor T4 can be connected with the second electrode block CE2.

As illustrated by FIG. 9D, the second connection block 161B is connected to a drain electrode of the second light emission control transistor T5 through a third via hole H3, and the second connection block 161B can be used to be connected with the first electrode 181 formed later, so as to apply a driving signal of the drain electrode of the second light emission control transistor T5 to the first electrode 181. Due to the large number of film layers of the driving circuit of the light emitting substrate, compared with directly connecting the first electrode and the drain electrode of the second light emission control transistor through one via hole, the stability of the electrical connection between the first electrode and the drain electrode of the second light emission control transistor can be improved by arranging the second connection block, and the manufacturing difficulty of the via holes can be reduced.

As illustrated by FIG. 9D, the third connection block 161C is connected with the source electrode of the second light emission control transistor T5 through a fourth via hole H4, and the third connection block 161C is connected with the source electrode of the compensation transistor T3 through a fifth via hole H5, thereby connecting the source electrode of the second light emission control transistor T5 with the source electrode of the compensation transistor T3. Because the driving circuit uses two kinds of semiconductor layers (i.e., the first semiconductor layer and the second semiconductor layer), the source electrode of the second light emission control transistor T5 can be connected with the source electrode of the compensation transistor T3 by arranging the third connection block.

As illustrated by FIG. 9D, the fourth connection block 161D is connected with a source electrode of the data writing transistor T2 through a sixth via hole H6, and the fourth connection block 161D can be used to be electrically connected with a data line formed later, so as to connect the data line with the source electrode of the data writing transistor T2. Due to the large number of film layers of the driving circuit of the light emitting substrate, compared with directly connecting the data line with the source electrode of the data writing transistor through one via hole, the stability of the electrical connection between the data line and the source electrode of the data writing transistor can be improved by arranging the fourth connection block, and the manufacturing difficulty of the via holes can be reduced.

As illustrated by FIG. 9D, the fifth connection block 161E is connected with the first electrode block CE1 through a seventh via hole H7, and the fifth connection block 161E is connected with the drain electrode of the compensation transistor T3 and the source electrode of the reset transistor T6 through an eighth via hole H8, so that the first electrode block CE1 (which also serves as the gate electrode of the driving transistor T1), the drain electrode of the compensation transistor T3 and the source electrode of the reset transistor T6 can be electrically connected.

As illustrated by FIG. 9D, the sixth connection block 161F is connected with the source electrode of the reset transistor T6 through a ninth via hole H9, and the sixth connection block 161F is connected with the first initialization signal line 142C through a tenth via hole H10, so that the source electrode of the reset transistor T6 can be electrically connected with the first initialization signal line 142C.

As illustrated by FIG. 9D, the second initialization signal line 161G is connected to the source electrode of the electrode reset transistor T7 through an eleventh via hole H11, so that an initialization signal can be applied to the source electrode of the electrode reset transistor T7.

Figure 9E:
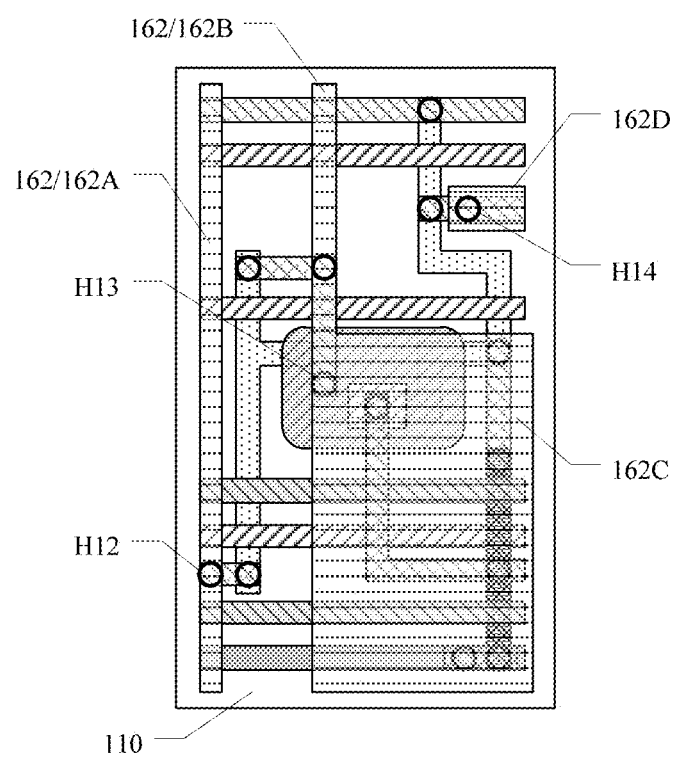

As illustrated by FIG. 9E, the light emitting substrate 100 further includes a second conductive layer 162, which is located at a side of the first conductive layer 161 away from the base substrate 110. It should be noted that, a fifth insulating layer 155 is arranged between the first conductive layer 161 and the second conductive layer 162. In order to clearly show the relationship between the second conductive layer 162 and the film layer under the second conductive layer 162, the fifth insulating layer 155 is not shown in FIG. 9E, and the arrangement of the fifth insulating layer 155 can be seen in FIGS. 7A and 7B.

In some examples, the material of the second conductive layer 162 may be a laminated structure of titanium/aluminum/titanium, with a thickness ranging from 5000 to 8000 nm; for example, thicknesses of titanium metal can be 457 nm and 495 nm respectively, and a thickness of aluminum metal can be 6010 nm.

As illustrated by FIG. 9E, the second conductive layer 162 includes a data line 162A, a power line 162B, a power line widening portion 162C and a connection electrode 162D. The data line 162A is connected with the fourth connection 161D through a twelfth via hole H12, so as to be connected with the source electrode of the data writing transistor T2. The power line 162B is connected with the first connection block 161A through a thirteenth via hole H13, so as to be connected to the source electrode of the first light emission control transistor T4 and the second electrode block CE2.

As illustrated by FIG. 9E, the power line widening portion 162C is connected to the power line 162B, and a size of the power line widening portion 162C in a direction perpendicular to the power line 162B is larger than three times of a size of the data line 162A in the direction perpendicular to the power line 162B, so that the resistance of the power line 162B can be reduced. In addition, if the subsequent film preparation needs to be carried out in a high-temperature environment, the power line widening portion 162C can also protect the film layer below the power line widening portion 162C.

As illustrated by FIG. 9E, the connection electrode 162D is connected with the second connection block 161B through a fourteenth via hole H14. The connection electrode 162D can be used to be connected with the first electrode 181 formed later, so that a driving signal of the drain electrode of the second light emission control transistor T5 is applied to the first electrode 181 through the second connection block 161B and the connection electrode 162D. Due to the large number of film layers of the driving circuit of the light emitting substrate, compared with directly connecting the first electrode and the drain electrode of the second light emission control transistor through one via hole, the stability of the electrical connection between the first electrode and the drain electrode of the second light emission control transistor can be further improved by arranging the second connecting block and the connection electrode, and the manufacturing difficulty of the via hole is reduced.

An operation mode of the driving circuit shown in FIGS. 8 and 9A-9E will be schematically described below. First, upon a reset signal being transmitted to the first reset signal line 141A and the electrode reset transistor T7 being turned on, the residual current flowing through the first electrode of each sub-pixel region is discharged through the electrode reset transistor T7, so that light emission caused by the residual current flowing through an anode of each sub-pixel region can be suppressed. Then, upon a reset signal being transmitted to the second reset signal line 142B and an initialization signal being transmitted to the first initialization signal line 142C, the reset transistor T6 is turned on, and an initialization voltage Vint is applied to the gate electrode of the driving transistor T1 and the first electrode block CE1 of the storage capacitor Cst through the reset transistor T6, so that the gate electrode of the driving transistor T1 and the storage capacitor Cst are initialized. The gate initialization of the driving transistor T1 can turn on the first thin film transistor T1.

Then, upon the gate signal being transmitted to the first gate line 141C and the data signal being transmitted to the data line 162A, the data writing transistor T2 is turned on; a gate signal is transmitted to the second gate line 142A, the compensation thin film transistor T3 is turned on, and a data voltage Vd is applied to the gate electrode of the driving transistor T1 through the data writing transistor T2 and the compensation thin film transistor T3. In this case, the voltage applied to the gate electrode of the driving transistor T1 is a compensation voltage Vd+Vth, and the compensation voltage applied to the gate electrode of the driving transistor T1 is also applied to the first electrode block CE1 of the storage capacitor Cst.

Subsequently, the power supply line 162B applies a driving voltage Vel to the second electrode block CE2 of the storage capacitor Cst, and applies the compensation voltage Vd+Vth to the first electrode block CE1, so that the charge corresponding to the difference between the voltages respectively applied to the two electrodes of the storage capacitor Cst is stored in the storage capacitor Cst, and the driving transistor T1 is turned on for a predetermined time.

Subsequently, upon the emission control signal being applied to the emission control line 141B, both the first emission control transistor T4 and the second emission control transistor T5 are turned on, so that the first emission control transistor T4 and the second emission control transistor T5 apply the driving voltage Vel. Upon the driving voltage Vel passing through the driving transistor T1 conducted by the storage capacitor Cst, a driving current Id corresponding to the difference between the corresponding driving voltage Vel and the voltage applied to the gate electrode of the driving transistor T1 through the storage capacitor Cst flows through the drain electrode of the driving transistor T1, and then the driving current Id is applied to the first electrode 181 of each sub-pixel region through the second light emission control transistor T5, so that the light emitting layer of each sub-pixel region emits light.

It should be noted that the above-mentioned working mode of the driving circuit is only one possible driving mode of the driving circuit, and the embodiment includes, but is not limited thereto.

In some examples, the materials of the first insulating layer, the second insulating layer, the third insulating layer and the fourth insulating layer can be any one selected from the group consisting of silicon nitride, silicon oxide and silicon oxynitride or a laminated structure of at least two selected from the group consisting of silicon nitride, silicon oxide and silicon oxynitride.

Figure 10A:
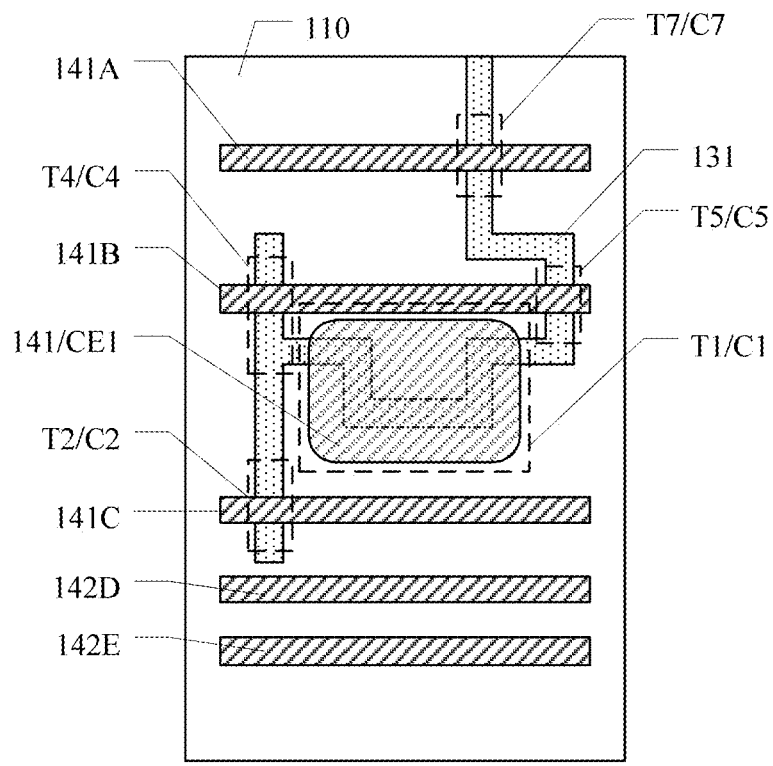
FIGS. 10A-10C are schematic layout diagrams of a driving circuit of another light emitting substrate provided by an embodiment of the present disclosure.
Figure 10B:
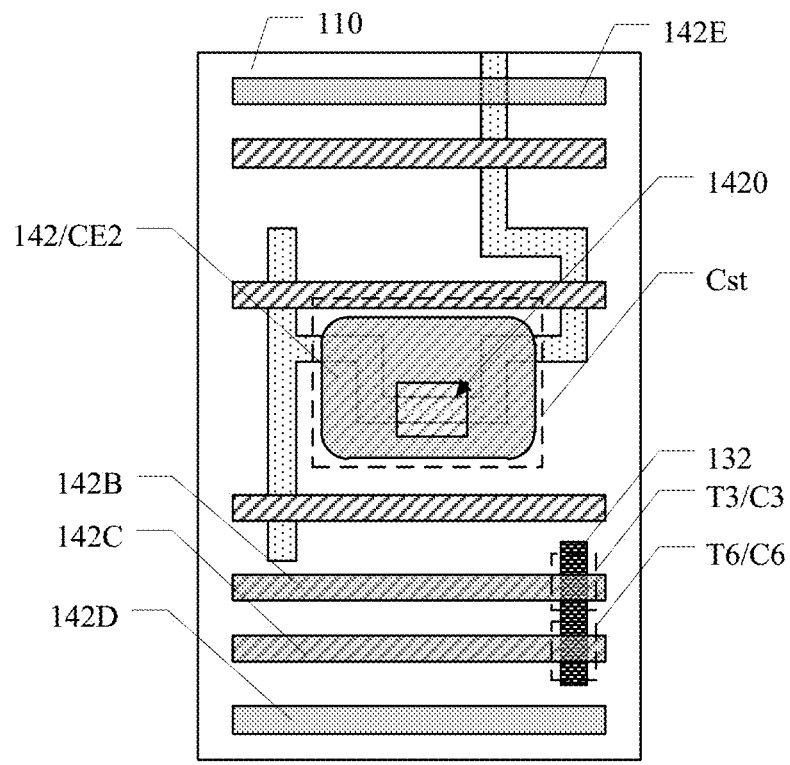
Figure 10C:
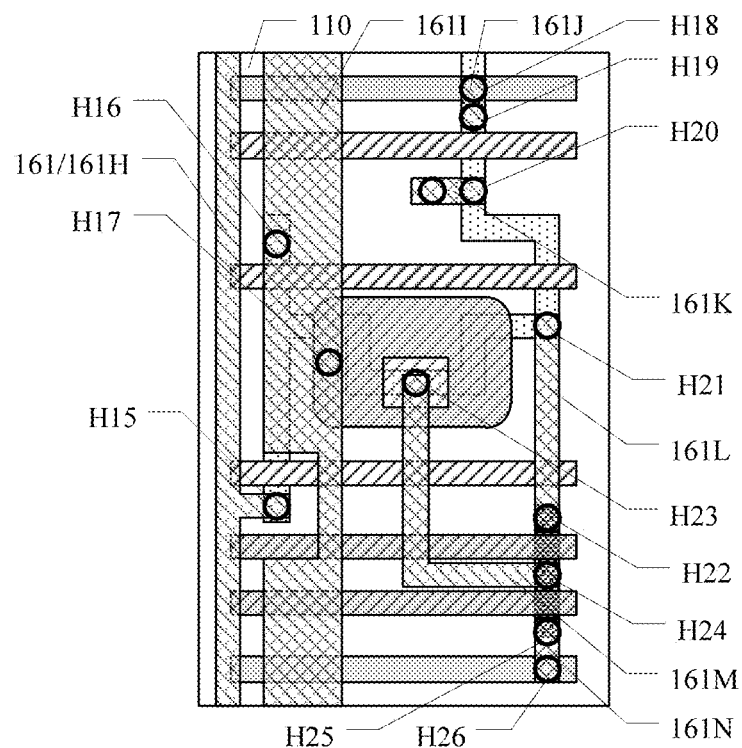

FIGS. 10A-10C are schematic layout diagrams of driving circuits of another light emitting substrate provided by an embodiment of the present disclosure.

As illustrated by FIG. 10A, the light emitting substrate 100 includes a base substrate 110, a first semiconductor layer 131 and a first gate layer 141; the first semiconductor layer 131 is located on the base substrate 110, and the first gate layer 141 is located at a side of the first semiconductor layer 131 away from the base substrate. The first semiconductor layer 131 includes an active layer C1 of the driving transistor T1, an active layer C2 of the data writing transistor T2, an active layer C4 of the first light emission control transistor T4, an active layer C5 of the second light emission control transistor T5 and an active layer C7 of the electrode reset transistor T7. The first semiconductor layer 131 can be made of low-temperature polycrystalline silicon (LTPS) material, so that the driving transistor T1, the data writing transistor T2, the first light emission control transistor T4, the second light emission control transistor T5 and the electrode reset transistor T7 need higher mobility and more stable source electrode voltage.

In some examples, the first semiconductor layer 131 is made of polysilicon, and a thickness of the first semiconductor layer 131 may range from 400 to 600 nm, such as 582 nm. The first gate layer 141 is made of molybdenum, and a thickness of the first gate layer 141 can range from 2000 to 4000 nm, for example, 2800 nm.

As illustrated by FIG. 10A, the first gate layer 141 includes a first reset signal line 141A, a light emission control line 141B, a first gate line 141C, a first electrode block CE1, a second gate line 141D and a second reset line 141E; the first reset signal line 141A, the light emission control line 141B, the first electrode block CE1, the first gate line 141C, the second gate line 141D and the second reset line 141E can be arranged in sequence along the direction perpendicular to the first reset signal line 141, and an orthographic projection of the first electrode block CE1 on the base substrate 110 is located between orthographic projections of the light emission control line 141B and the first gate line 141C on the base substrate 110; orthographic projections of the second gate line 141D and the second reset line 141E on the base substrate 110 are located at a side of an orthographic projection of the first gate line 141C on the base substrate 110 away from the light emission control line 141B.

As illustrated by FIG. 10A, the first reset signal line 141A overlaps with the active layer C7 of the electrode reset transistor T7, that is, an orthographic projection of the first reset signal line 141A on the base substrate 110 overlaps with the orthographic projection of the active layer C7 of the electrode reset transistor T7 on the base substrate 110. The light emission control line 141B overlaps with the active layer C4 of the first light emission control transistor T4 and the active layer C5 of the second light emission control transistor T5, that is, an orthographic projection of the light emission control line 141B on the base substrate 110 overlaps with the orthographic projection of the active layer C4 of the first light emission control transistor T4 and the orthographic projection of the active layer C5 of the second light emission control transistor T5 on the base substrate 110, respectively. The first gate line 141C overlaps with the active layer C2 of the data writing transistor T2, that is, an orthographic projection of the first gate line 141C on the base substrate 110 overlaps with an orthographic projection of the active layer C2 of the data writing transistor T2 on the base substrate 110.

As illustrated by FIG. 10A, a channel width-length ratio of the driving transistor T1 is larger than two times of a channel width-length ratio of the data writing transistor T2, which is beneficial to reduce current fluctuation and improve the stability of the output current.

As illustrated by FIG. 10A, a source electrode of the driving transistor T1, a drain electrode of the data writing transistor T2 and a drain electrode of the first light emission control transistor T4 are connected in the first semiconductor layer 131; a drain electrode of the driving transistor T1 and a source electrode of the second light emission control transistor T5 are also connected in the first semiconductor layer 131.

As illustrated by FIG. 10B, the light emitting substrate 100 further includes a second gate layer 142 and a second semiconductor layer 132; the second semiconductor layer 132 is located at a side of the first gate layer 141 away from the base substrate 110, and the second gate layer 142 is located at a side of the second semiconductor layer 132 away from the base substrate 110. The second semiconductor layer 132 can be made of oxide semiconductor material, so that the reset transistor T6 and the compensation transistor T3 have lower leakage current.

In some examples, the second gate layer 142 can be made of molybdenum, and the thickness of the second gate layer 142 can range from 2000 to 4000 nm, such as 3000 nm. The second semiconductor layer 132 is made of indium gallium zinc oxide (IGZO), and a thickness of the second semiconductor layer 132 can range from 300 nm to 600 nm, such as 445 nm. Of course, the second semiconductor layer 132 can also be made of other metal oxide semiconductors, such as c-axis oriented crystal oxide semiconductors.

As illustrated by FIG. 10B, the second semiconductor layer 132 includes an active layer C3 of the compensation transistor T3 and an active layer C6 of the reset transistor T6; the drain electrode of the compensation transistor T3 and the drain electrode of the reset transistor T6 are connected in the second semiconductor layer 132. An orthographic projection of the second semiconductor layer 132 on the base substrate 110 overlaps with orthographic projections of the second gate line 141D and the second reset line 141E on the base substrate 110, respectively, so that the active layer C3 of the compensation transistor T3 and the active layer C6 of the reset transistor T6 can be defined.

As illustrated by FIG. 10B, the second gate layer 142 includes a second electrode block CE2, a third auxiliary line 142B, a fourth auxiliary line 142C, a first initialization signal line 142D and a second initialization signal line 142E; the second electrode block CE2, the third auxiliary line 142B, the fourth auxiliary line 142C and the first initialization signal line 142D may be sequentially arranged along a direction perpendicular to an extending direction of the first initialization signal line 142D. The orthographic projection of the second electrode block CE2 on the base substrate 110 is located between orthographic projections of the light emission control line 141B and the first gate line 141C on the base substrate 110.

As illustrated by FIG. 10B, an orthographic projection of the third auxiliary line 142B on the base substrate 110 overlaps with an orthographic projection of the active layer C3 of the compensation transistor T3 on the base substrate 110, thus forming the compensation transistor T3 with a double-gate structure with the second gate line 141D; the orthographic projection of the fourth auxiliary line 142C on the base substrate 110 overlaps with the orthographic projection of the active layer C6 of the reset transistor T6 on the base substrate 110, so that the second auxiliary line 142c and the second reset line 141E can form the reset transistor T6 with a double-gate structure, thereby further reducing the leakage current of the compensation transistor T3 and the reset transistor T6.

As illustrated by FIG. 10B, the orthographic projection of the third auxiliary line 142B on the base substrate 110 overlaps with, or even completely overlaps with, the orthographic projection of the second gate line 141D on the base substrate 110; the orthographic projection of the fourth auxiliary line 142C on the base substrate 110 overlaps with, or even completely overlaps with, the orthographic projection of the second reset line 141E on the base substrate 110.

As illustrated by FIG. 10B, the orthographic projection of the second electrode block CE2 on the base substrate 110 overlaps with the orthographic projection of the first electrode block CE1 on the base substrate 110, so that a storage capacitor Cst can be formed. The second electrode block CE2 may be provided with an opening 142O to expose a part of the first electrode block CE1. The orthographic projection of the opening 142O on the base substrate 110 overlaps with the orthographic projection of the active layer C1 of the driving transistor T1 on the base substrate 110.

It should be noted that, compared with the driving circuit shown in FIGS. 9A-9E, the pixel driving circuit shown in FIGS. 10A-10E does not need to be provided with a third gate layer, thereby saving a mask process and materials and further reducing the cost.

As illustrated by FIG. 10C, the light emitting substrate 100 further includes a first conductive layer 161, which is located at a side of the second gate layer 142 away from the base substrate 110. The first conductive layer 161 includes a data line 161H, a power line 161I, a seventh connection block 161J, an eighth connection block 161K, a ninth connection block 161L, a tenth connection block 161M and an eleventh connection block 161N.

As illustrated by FIG. 10C, the data line 161H includes an extension portion and a protrusion protruding from the extension portion, and the protrusion is connected with the source electrode of the data writing transistor T2 through a fifteenth via hole H15. An orthographic projection of the power line 161I on the base substrate 110 overlaps with an orthographic projection of the source electrode of the light emission control transistor T4 on the base substrate and an orthographic projection of the second electrode block CE2 on the base substrate 110, respectively, the power line 161I can be connected with the source electrode of the light emission control transistor T4 through a sixteenth via hole H16, and the power line 161I can be connected with the second electrode block CE2 through a seventeenth via hole H17.

For example, as illustrated by FIG. 10C, the power line 161I has a hollow at a position where the source electrode of the data writing transistor T2 is located, so that it is convenient for the protrusion to be connected with the source electrode of the data writing transistor T2 through the fifteenth via hole H15.

As illustrated by FIG. 10C, an orthographic projection of the seventh connection block 161J on the base substrate 110 overlaps with the orthographic projection of the source electrode of the electrode reset transistor T7 on the base substrate 110 and the orthographic projection of the second initialization signal line 142E on the base substrate 110, respectively, the seventh connection block 161J can be connected with the second initialization signal line 142E through the eighteenth via hole H18, and the seventh connection block 161J can be connected with the source electrode of the electrode reset transistor T7 through a nineteenth via hole H19.

As illustrated by FIG. 10C, an orthographic projection of the eighth connection block 161K on the base substrate 110 overlaps with the orthographic projection of the drain electrode of the second light emission control transistor T5 on the base substrate 110, and the eighth connection block 161K can be connected with the drain electrode of the second light emission control transistor T5 through the twentieth via hole H20.

As illustrated by FIG. 10C, an orthographic projection of the ninth connection block 161L on the base substrate 110 overlaps with the orthographic projection of the source electrode of the second light emission control transistor T5 and the orthographic projection of the source electrode of the compensation thin film transistor T3 on the base substrate 110, respectively, and the ninth connection block 161L can be connected with the source electrode of the light emission control transistor T5 through a twenty-first via hole H21, and the ninth connection block 161L can be connected with the source electrode of the compensation thin film transistor T3 through a twenty-second via hole H22.

As illustrated by FIG. 10C, an orthographic projection of the tenth connection block 161M on the base substrate 110 overlaps with an orthographic projection of the opening 142O of the second electrode block CE2 on the base substrate 110 and an orthographic projection of the drain electrode of the compensation transistor T3 on the base substrate 110, respectively, the tenth connection block 161M can be connected to the first electrode block CE1 through a twenty-third via hole H23, and the tenth connection block 161M can be connected to the drain electrode of the compensation transistor T3 through the twenty-fourth via hole H24.

For example, as illustrated by FIG. 10C, a shape of an orthographic projection of the tenth connection block 161M on the base substrate may be L-shaped. Of course, embodiment of the present disclosure includes but is not limited thereto.

As illustrated by FIG. 10C, the orthographic projection of the eleventh connection block 161N on the base substrate 110 overlaps with the orthographic projection of the source electrode of the reset transistor T6 on the base substrate 110 and the orthographic projection of the first initialization signal line 142D on the base substrate 110, respectively, the eleventh connection block 161N can be connected to the source electrode of the reset transistor T6 through a twenty-fifth via hole H25, and the eleventh connection block 161N can be connected to the first initialization signal line 142D through a twenty-sixth via hole H26.

It should be noted that, compared with the driving circuit shown in FIGS. 9A-9E, the first conductive layer in the pixel driving circuit shown in FIGS. 10A-10E integrates the function of the second conductive layer, so the second conductive layer does not need to be provided, thereby saving a mask process and materials and further reducing the cost.

In some examples, the first conductive layer 161 may be a laminated structure of titanium/aluminum/titanium with a thickness ranging from 5,000 nm to 8,000 nm; for example, thicknesses of titanium metal can be 342 nm and 570 nm respectively, and the thickness of aluminum metal can be 6026 nm.

Figure 11:
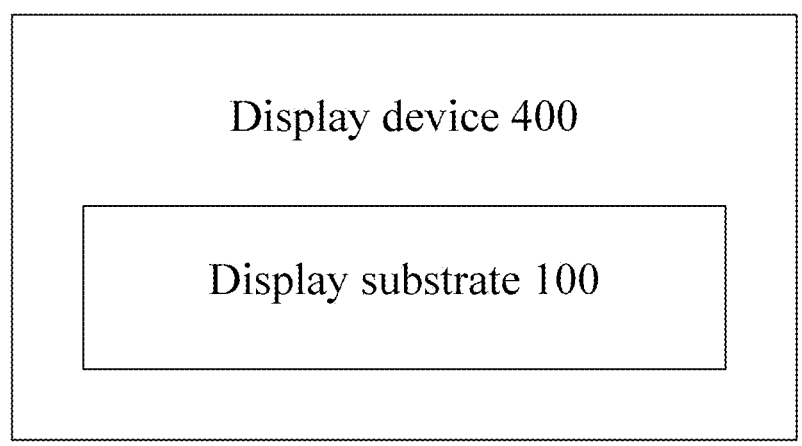
FIG. 11 is a schematic diagram of a display device provided by an embodiment of the present disclosure.

An embodiment of the present disclosure further provides a display device. FIG. 11 is a schematic diagram of a display device provided by an embodiment of the present disclosure. As illustrated by FIG. 11, the display device 400 includes any one of the display substrates 100 mentioned above. Therefore, the display device has beneficial effects corresponding to those of the display substrate. For example, the display device can reduce the load of the gate layer, thereby increasing the charging time of the driving circuit and further improving the display effect of the display substrate.

Figure 12A:
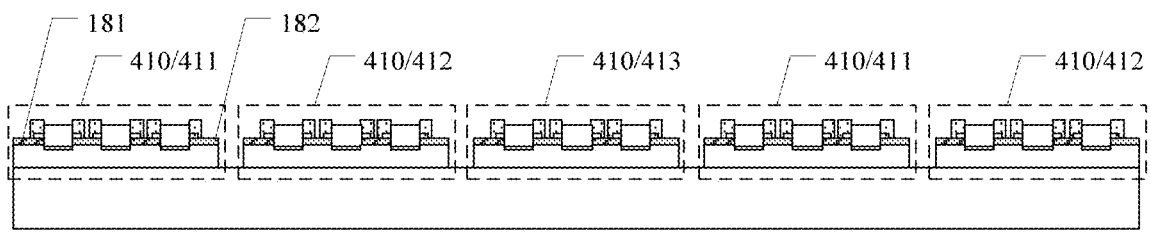
FIG. 12A is a schematic diagram of another display device provided by an embodiment of the present disclosure.

FIG. 12A is a schematic diagram of another display device provided by an embodiment of the present disclosure. As illustrated by FIG. 12A, in the display device, the light emitting substrate 100 includes a plurality of first electrodes 181 arranged in an array and a plurality of second electrodes 182 arranged in an array; because one first electrode 181 and one second electrode 182 can constitute an electrode pair, one electrode pair corresponds to one sub-pixel region 410. Therefore, the light emitting substrate can include a plurality of sub-pixel regions 410, which can include a sub-pixel region 411 emitting light of a first color, a sub-pixel region 412 emitting light of a second color and a sub-pixel region 413 emitting light of a third color, thereby realizing color display. For example, the first color may be red, the second color may be green and the third color may be blue.

Figure 12B:
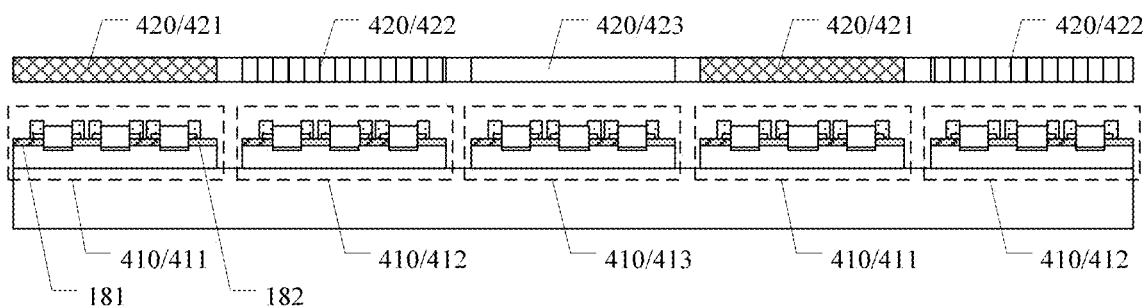
FIG. 12B is a schematic diagram of still another display device provided by an embodiment of the present disclosure.

FIG. 12B is a schematic diagram of another display device provided by an embodiment of the present disclosure. As illustrated by FIG. 12B, the display device 400 further includes a color conversion layer 420 arranged at a light emitting side of the light emitting substrate 100. In this case, the plurality of sub-pixel regions 400 in the light emitting substrate 100 emit light of the same wavelength band, such as white light or blue light; the light emitted by the light emitting substrate 100 can be converted by the color conversion layer 420 to form different colors, thereby realizing color display.

For example, the color conversion layer 420 may include a color film layer, a quantum dot light emitting layer, or a laminated structure of a color film layer and a quantum dot light emitting layer.

For example, if the sub-pixel regions 400 all emit white light, the color conversion layer 420 may include a first color conversion layer 421, a second color conversion layer 422 and a third color conversion layer 423. The first color conversion layer 421 is configured to convert light emitted by the sub-pixel region 400 into light of a first color, the second color conversion layer 422 is configured to convert light emitted by the sub-pixel region 400 into light of a second color, and the third color conversion layer 423 is configured to convert light emitted by the sub-pixel region 400 into light of a third color. For example, the first color may be red, the second color may be green and the third color may be blue.

For example, if the sub-pixel regions 400 all emit blue light, the color conversion layer 420 may include a first color conversion layer 421, a second color conversion layer 422 and a transparent material layer 423 including scattering particles. The first color conversion layer 421 is configured to convert the blue light emitted by the sub-pixel region 400 into light of a first color, the second color conversion layer 422 is configured to convert the blue light emitted by the sub-pixel region 400 into light of a second color, and the transparent material layer 423 is configured to transmit and emit the blue light emitted by the sub-pixel region 400. For example, the first color may be red and the second color may be green.

For example, the display device can be an electronic product with display function such as a TV, a computer, a notebook computer, a tablet computer, a mobile phone, a navigator, an electronic photo frame and the like.

The following points required to be explained:
(1) the drawings of the embodiments of the present disclosure only relate to the structures related to the embodiments of the present disclosure, and other structures can refer to the general design.
(2) without conflict, the features in a same embodiment and in different embodiments may be combined with each other.

What are described above is related to only the illustrative embodiments of the present disclosure and not limitative to the protection scope of the present application. Therefore, the protection scope of the present application shall be defined by the accompanying claims.

The invention claimed is:

1. A light emitting substrate, comprising:
a base substrate;
an electrode planarization layer, located on the base substrate; and
an electrode layer, located at a side of the electrode planarization layer away from the base substrate,
wherein the electrode layer comprises a first electrode and a second electrode, the first electrode comprises at least one first electrode strip, and the second electrode comprises at least one second electrode strip,
the at least one first electrode strip and the at least one second electrode strip are spaced and alternately arranged in a first direction, each of the at least one first electrode strip and each of the at least one second electrode strip extend along a second direction, and the second direction intersects with the first direction,
the electrode planarization layer comprises a first groove between a first electrode strip and a second electrode strip which are adjacent to each other, and the first groove is configured to accommodate a light emitting diode;
the first electrode comprises a plurality of first electrode strips, and the second electrode comprises a plurality of second electrode strips, and the plurality of first electrode strips and the plurality of second electrode strips are alternately arranged in the first direction;
at least one of the first groove is arranged between any one of the plurality of first electrode strips and a second electrode strip which is adjacent to the any one of the plurality of first electrode strips in the first direction.

2. The light emitting substrate according to claim 1, wherein a plurality of the first grooves are arranged between any one of the plurality of first electrode strips and a second electrode strip which is adjacent to the any one of the plurality of first electrode strips in the first direction, and the plurality of the first grooves are arranged along the second direction intersecting with the first direction.

3. The light emitting substrate according to claim 1, wherein the first electrode further comprises a first connection electrode, the first connection electrode extends along the second direction intersecting with the first direction and connecting the plurality of the first electrode strips;
the second electrode further comprises a second connection electrode, the second connection electrode extends along the second direction and connects the plurality of the second electrode strips; and
the first connection electrode is located at a side of the plurality of first electrode strips or the plurality of second electrode strips away from the second connection electrode.

4. The light emitting substrate according to claim 3, wherein the electrode planarization layer further comprises:
   a second groove, located between the first connection electrode and any one of the plurality of second electrode strips; and
   a third groove, located between the second connection electrode and any one of the plurality of first electrode strips.

5. The light emitting substrate according to claim 4, wherein the second groove has a same size and a same shape as the first groove, and the third groove has a same size and a same shape as the first groove.

6. The light emitting substrate according to claim 1, further comprising:
   an insulation defining layer, located at a side of the electrode layer away from the base substrate,
   wherein the insulation defining layer comprises a pixel opening, and an orthographic projection of the at least one first groove on the base substrate falls within an orthographic projection of the pixel opening on the base substrate.

7. The light emitting substrate according to claim 6, wherein the insulation defining layer further comprises:
   a retaining wall structure, located in the pixel opening and at least at two sides of the first groove in the first direction.

8. The light emitting substrate according to claim 1, wherein a size range of an orthographic projection of the first groove on the base substrate in the first direction is 2 to 50 microns, and a size range of an orthographic projection of the first groove on the base substrate in a direction perpendicular to the first direction is 2 to 50 microns.

9. The light emitting substrate according to claim 1, wherein a size range of the first groove in the direction perpendicular to the base substrate is 100 to 5000 nm.

10. The light emitting substrate according to claim 1, further comprising:
    a light emitting diode at least partially located in the first groove,
    wherein the light emitting diode comprises a first pin and a second pin, the first pin is connected with the first electrode strip and the second pin is connected with the second electrode strip.

11. The light emitting substrate according to claim 10, wherein a size of an orthographic projection of the first groove on the base substrate in the first direction is larger than a size of the light emitting diode in the first direction, and a size of the first groove in a direction perpendicular to the base substrate is larger than ¼ of a size of the light emitting diode in the direction perpendicular to the base substrate.

12. The light emitting substrate according to claim 10, wherein the light emitting diode further comprises:
    a first semiconductor layer, located at a side of the first pin;
    a light emitting layer, located at a side of the first semiconductor layer away from the first pin; and
    a second semiconductor layer, located at a side of the light emitting layer away from the first semiconductor layer,
    wherein the second pin is located at a side of the second semiconductor layer away from the light emitting layer.

13. The light emitting substrate according to claim 1, further comprising:
    a driving circuit layer, located between the base substrate and the electrode planarization layer,
    wherein the driving circuit layer comprises a plurality of driving circuits, the anode layer comprises a plurality of first electrodes, and the plurality of driving circuits and the plurality of first electrodes are arranged in one-to-one correspondence, and each of the plurality of driving circuits is electrically connected with a corresponding first electrode.

14. The light emitting substrate according to claim 13, wherein the driving circuit comprises a driving transistor, a data writing transistor, a first light emission control transistor, a second light emission control transistor, an electrode reset transistor, a reset transistor and a compensation transistor,
    active layers of the driving transistor, the data writing transistor, the first light emission control transistor, the second light emission control transistor and the electrode reset transistor are made of low-temperature polycrystalline silicon, and active layers of the reset transistor and the compensation transistor are made of a metal oxide.

15. The light emitting substrate according to claim 14, wherein a channel width-length ratio of the driving transistor is greater than two times of a channel width-length ratio of the data writing transistor.

16. The light emitting substrate according to claim 14, wherein the reset transistor and the compensation transistor adopt a double-gate structure.

17. A display device, comprising the light emitting substrate according to claim 1.

* * * * *